United States Patent
Irie et al.

(10) Patent No.: US 6,903,491 B2
(45) Date of Patent: Jun. 7, 2005

(54) PIEZOELECTRIC ELEMENT, ACTUATOR, AND INKJET HEAD

(75) Inventors: Yousuke Irie, Nara (JP); Kazuo Yokoyama, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 50 days.

(21) Appl. No.: 10/128,115

(22) Filed: Apr. 23, 2002

(65) Prior Publication Data

US 2002/0180843 A1 Dec. 5, 2002

(30) Foreign Application Priority Data

Apr. 26, 2001 (JP) ........................................ 2001-128875

(51) Int. Cl.⁷ .............................................. H01L 41/08
(52) U.S. Cl. ...................................................... 310/328
(58) Field of Search ........................................ 310/328

(56) References Cited

U.S. PATENT DOCUMENTS

| | | | |
|---|---|---|---|
| 5,134,335 A | | 7/1992 | Ikemoto et al. ............. 310/328 |
| 5,270,298 A | | 12/1993 | Ramesh ......................... 505/1 |
| 5,650,362 A | * | 7/1997 | Nashimoto ............... 427/126.3 |
| 5,988,799 A | | 11/1999 | Abe et al. ...................... 347/68 |
| 6,111,284 A | | 8/2000 | Sakurai ....................... 257/310 |
| 6,218,764 B1 | | 4/2001 | Yoshida et al. ............. 310/317 |
| 6,290,340 B1 | * | 9/2001 | Kitahara et al. ............. 347/70 |
| 6,470,125 B1 | * | 10/2002 | Nashimoto et al. ......... 385/122 |
| 6,555,886 B1 | * | 4/2003 | Xu et al. ..................... 257/410 |

FOREIGN PATENT DOCUMENTS

| | | | |
|---|---|---|---|
| EP | 0 736 385 A1 | 10/1996 | ............ B41J/2/045 |
| EP | 0 886 328 A2 | 12/1998 | ............ H01L/41/09 |
| EP | 0 991 130 A1 | 4/2000 | ............ H01L/41/08 |
| JP | 2000141643 A | 5/2000 | ............ B41J/2/045 |
| JP | 2000261058 A | 9/2000 | ............ H01L/41/09 |
| JP | 2000285626 A | 10/2000 | ............ G11B/21/16 |
| JP | 2001088310 A | 4/2001 | ............. B41J/2/16 |
| JP | 2001309673 A | 11/2001 | ............ H02N/6/73 |

OTHER PUBLICATIONS

Copy of European Search Report No. EP 02 00 9494; completed Aug. 1, 2002.

* cited by examiner

*Primary Examiner*—Thomas M. Dougherty
(74) *Attorney, Agent, or Firm*—Harness, Dickey & Pierce, P.L.C.

(57) ABSTRACT

A piezoelectric element includes: a piezoelectric film made of PZT; a pair of electrodes (a lower electrode and an upper electrode) arranged with the piezoelectric film being interposed therebetween; and a base film made of PLT having a thickness of about 50 nm to 200 nm and provided between the piezoelectric film and the lower electrode. The piezoelectric element, as a whole, is provided on a substrate, which may be a stainless steel substrate (polycrystalline), a heat-resistant glass substrate (amorphous), a silicon substrate (single crystal), etc. A piezoelectric element having a good piezoelectric characteristic can be provided on a substrate other than a single crystal substrate.

6 Claims, 14 Drawing Sheets

PIEZOELECTRIC ELEMENT, ACTUATOR, AND INKJET HEAD

BACKGROUND OF THE INVENTION

The present invention relates to a piezoelectric element having a piezoelectric layer, and also to an actuator and an inkjet head using a piezoelectric element.

Piezoelectric members have been used in various devices for various purposes in the prior art. Examples of such devices include an actuator for producing a displacement according to a voltage applied to the piezoelectric member, and an acceleration sensor or an angular velocity sensor for producing a voltage from a displacement of the piezoelectric member.

A commonly used piezoelectric material is a lead-based dielectric material having a good piezoelectric characteristic, particularly, a perovskite-type ferroelectric material having a composition of $Pb(Zr_{1-x}Ti_x)O_3$ (abbreviated as "PZT"). In the prior art, a piezoelectric element is produced by shaping a sinter of a piezoelectric material (which has been obtained through a heat treatment) through a cutting process, a polishing process, etc., into a piezoelectric layer having a shape that is suitable for the intended purpose, and then providing a pair of electrodes on the two opposing surfaces of the piezoelectric layer.

In recent years, researches have been made in the art for reducing the size of various devices using the piezoelectric element, enhancing the functionality thereof, and reducing the power consumption thereof (reducing the driving voltage), so that the various devices can be used in micro-machines, micro-sensors, or the like. It is expected that this will enable a minute and precise control, etc., in various fields in which such a control has not been expected to be possible.

In view of this, aside from conventional manufacturing methods that use a sintering process, a cutting process, a polishing process, etc., researches have been made in the art for developing a subminiature piezoelectric element having a higher precision, by using minute process techniques that have been used in semiconductor processes, or the like, on a thin piezoelectric film formed on a substrate. However, in reducing the size of a piezoelectric element, there are many problems left to be solved, including how to cause, and detect, a minute displacement in a piezoelectric film with a high precision and a high efficiency.

Now, the process of forming a piezoelectric film on a substrate (thin film process), which is superior in terms of minuteness, precision, functionality and workability, is performed in a completely different way from the minute shaping process using a sinter, which has been used in the prior art. Therefore, it is necessary to realize a structure for a piezoelectric member and a piezoelectric element that is suitable for the thin film process. Commonly used methods for producing thin piezoelectric film having a good voltage characteristic include a CVD method, a sputtering method, and a sol-gel method. With these methods, it is difficult to obtain a good characteristic unless a thin PZT film is epitaxially grown using a single crystal substrate such as an MgO single crystal substrate or an $SrTiO_3$ single crystal substrate. Moreover, in order to stably obtain a piezoelectric characteristic, it is necessary to deposit a piezoelectric film of $(Pb,La)TiO_3$, $PbTiO_2$, or the like, on a single crystal substrate. An MgO single crystal substrate, an $SrTiO_3$ single crystal substrate, and the like, have been used as the single crystal substrate.

However, substrates such as an MgO single crystal substrate and an $SrTiO_3$ single crystal substrate are very expensive and have a size of about 30 mm×30 mm. Thus, such a substrate of a large area cannot be obtained. On the other hand, there are no techniques established in the art for forming a piezoelectric film of a good piezoelectric characteristic on a substrate other than a single crystal substrate.

SUMMARY OF THE INVENTION

An object of the present invention is to provide an inexpensive piezoelectric element having a high functionality and various devices using the same by realizing a technique for forming a piezoelectric film having a good piezoelectric characteristic without using a single crystal substrate.

A piezoelectric element of the present invention is a piezoelectric element provided on a substrate, including: a base film having a thickness that is equal to or greater than 50 nm and less than or equal to 200 nm; and a piezoelectric film provided so as to oppose the substrate with the base film being interposed therebetween.

It has been confirmed that, in this way, it is possible to obtain a piezoelectric film having a good piezoelectric characteristic irrespective of the material of the substrate on which the base film is formed.

In a case where the piezoelectric element further includes a first electrode provided between the base film and the substrate, the voltage application to the piezoelectric member can be done by the first electrode if the substrate is an insulative member, and even if the substrate is a conductive member, the first electrode can be provided with, for example, the function of suppressing the reaction between the base film and the substrate.

In a case where the piezoelectric element further includes a second electrode provided so as to oppose the base film with the piezoelectric film being interposed therebetween, the voltage application to the piezoelectric member can be done by the second electrode.

In a case where the substrate is made of a polycrystalline or amorphous material, it is possible to form the piezoelectric element directly on the flexible substrate without using an expensive material such as a single crystal material. Therefore, by using the piezoelectric element in an actuator, it is possible to obtain an actuator having a reduced size, an enhanced functionality and a reduced power consumption.

It is preferred that the base film is made of an oxide having a cubic or tetragonal crystalline structure.

It is more preferred that the base film is made of a perovskite oxide whose constituent elements do not include Zr. Particularly, in a case where the base film is made of PLT, which is a perovskite oxide having a composition of $(Pb, La)TiO_3$, significant effects can be provided.

It is preferred that the piezoelectric film is made of a perovskite oxide containing Pb, Zr and Ti.

An actuator of the present invention includes: a fixed member; a moving member capable of moving with respect to the fixed member; and a piezoelectric element connected to the fixed member and the moving member, wherein the piezoelectric element includes: a base film having a thickness that is equal to or greater than 50 nm and less than or equal to 200 nm; and a piezoelectric film provided in contact with the base film.

In this way, it is possible to obtain a piezoelectric film having a good piezoelectric characteristic irrespective of the material of the substrate on which the base film is formed, whereby it is possible to obtain an actuator having a high precision and a high functionality using the piezoelectric element. Moreover, by reducing the size of the actuator while enhancing the functionality thereof and reducing the power consumption thereof, the actuator can be used in a micro-machine or a micro-sensor.

In one embodiment: the fixed member is attached to the moving member; the piezoelectric element is in contact with only the moving member; the base film is provided between the piezoelectric film and the moving member; and the piezoelectric element further includes an upper electrode that is provided on the piezoelectric film.

In such a case, the piezoelectric element may further include a lower electrode provided between the base film and the moving member. Then, the voltage application to the piezoelectric member can be done by the first electrode if the moving member is an insulative member, and even if the moving member is a conductive member, the first electrode can be provided with, for example, the function of suppressing the reaction between the base film and the moving member.

In one embodiment: the piezoelectric element is in contact with the moving member and the fixed member; and the base film is provided between one of the moving member and the fixed member and the piezoelectric film.

In such a case, the piezoelectric element may further include a first electrode provided between the base film and the one of the moving member and the fixed member. Then, functions/effects as those described above can be provided.

It is preferred that the piezoelectric element further includes a second electrode provided between the base film and the other one of the moving member and the fixed member.

In a case where at least one of the moving member and the fixed member is made of a flexible polycrystalline or amorphous material, it is possible to enhance the functionality of the actuator.

It is preferred that the base film is made of a perovskite oxide whose constituent elements do not include Zr.

An inkjet head of the present invention is an inkjet head, including: a head body in which a pressure chamber depression is formed, the pressure chamber depression including a supply port for supplying an ink and a discharge port for discharging an ink; a vibration plate provided so as to cover the depression of the head body to form, together with the depression, a pressure chamber; and a piezoelectric element provided on a surface of the vibration plate that opposes another surface thereof that is in contact with the pressure chamber, wherein the piezoelectric element includes: an upper electrode opposing the vibration plate; a piezoelectric film provided between the vibration plate and the upper electrode; and a base film provided between the vibration plate and the piezoelectric film and having a thickness that is equal to or greater than 50 nm and less than or equal to 200 nm.

In this way, it is possible to provide a piezoelectric element that includes a piezoelectric film having a good piezoelectric characteristic on a vibration plate irrespective of the material of the vibration plate, for example. Therefore, it is possible to, for example, reduce the size of the head body of the inkjet head, and to reduce the manufacturing cost of the inkjet head.

It is preferred that the inkjet head further includes a lower electrode provided between the vibration plate and the base film.

Moreover, in a case where the vibration plate is made of a polycrystalline or amorphous material, it is possible to use a flexible member as the vibration plate and to form the piezoelectric element directly on the flexible member.

The inkjet head may further include a polycrystalline film or an amorphous film provided between the lower electrode and the vibration plate.

It is preferred that the vibration plate is made of a metal.

It is preferred that the base film is made of an oxide having a cubic or tetragonal crystalline structure.

It is more preferred that the base film is made of a perovskite oxide whose constituent elements do not include Zr.

DESCRIPTION OF THE PREFERRED EMBODIMENTS

First Embodiment

Figure 1:
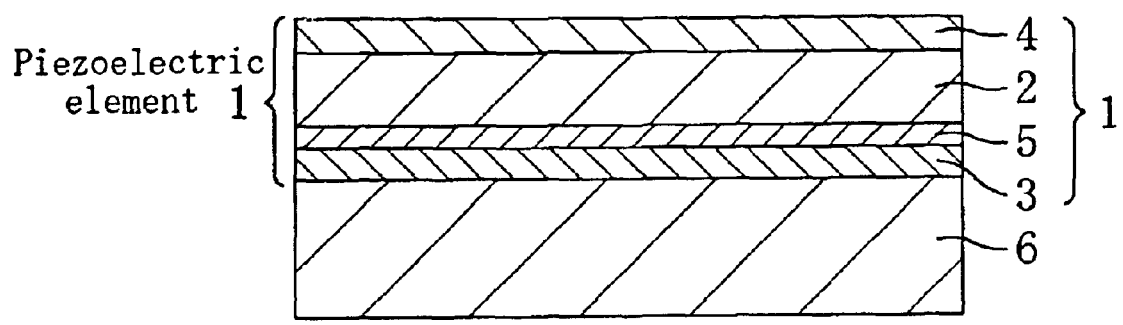
FIG. 1 is a cross-sectional view illustrating a structure of a piezoelectric element according to the first embodiment of the present invention.

FIG. 1 is a cross-sectional view illustrating a structure of a piezoelectric element 1 according to the first embodiment of the present invention. The piezoelectric element 1 of the present embodiment includes a piezoelectric film 2 having a thickness of 0.1 $\mu$m to 50 $\mu$m, a pair of electrodes (a lower electrode 3 and an upper electrode 4) arranged with the piezoelectric film 2 being interposed therebetween, and a base film 5 having a thickness of about 50 nm to 200 nm between the piezoelectric film 2 and the lower electrode 3. The piezoelectric element 1, as a whole, is provided on a substrate 6, which may be a stainless steel substrate (polycrystalline), a heat-resistant glass substrate (amorphous), a silicon substrate (single crystal), etc.

FIG. 2A to FIG. 2E are cross-sectional views illustrating the steps in a method for manufacturing a thin-film semiconductor element of the present embodiment.

Figure 2A:
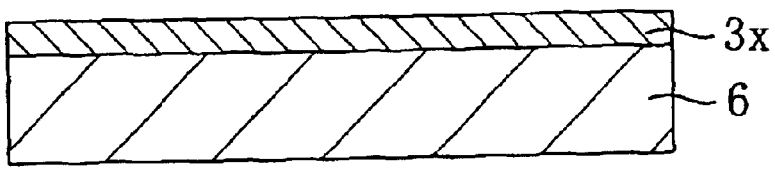
FIG. 2A to FIG. 2E are cross-sectional views illustrating the steps in a method for manufacturing a thin-film semiconductor element according to the first embodiment of the present invention.

First, in the step of FIG. 2A, a Pt film 3x to be the lower electrode having a thickness of 50 nm to 200 nm is formed on the substrate 6 by using a sputtering method, or a vapor deposition method.

Figure 2B:
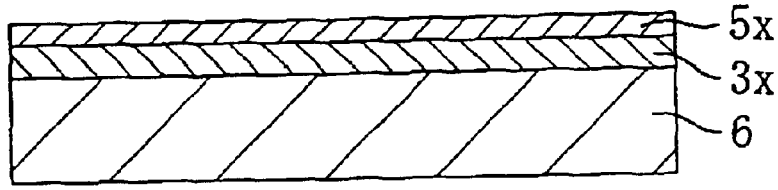

Then, in the step of FIG. 2B, a PLT film 5x to be the base film having a thickness of 50 nm to 200 nm is formed on the Pt film 3x by using a sputtering method, a CVD method, or a sol-gel method under a condition such that the substrate temperature is 500° C. to 700° C.

Figure 2C:
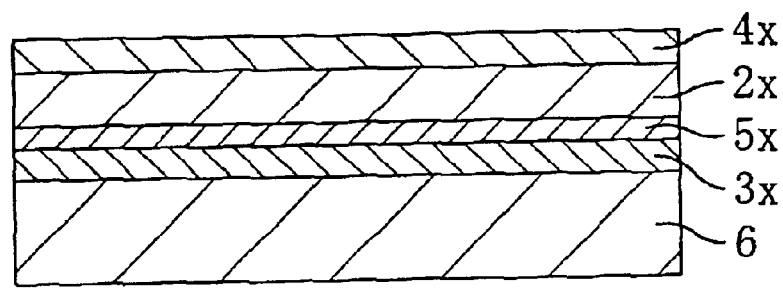

Then, in the step of FIG. 2C, a PZT film 2x to be the piezoelectric film having a thickness of 0.1 $\mu$m to 50 $\mu$m is formed on the PLT film 5x by using a sputtering method, a CVD method, or a sol-gel method. Furthermore, a noble metal film 4x of platinum (Pt), gold (Au), or the like, to be the upper electrode having a thickness of 50 nm to 300 nm is formed on the PZT film 2x by using a sputtering method or a vapor deposition method.

Figure 2D:
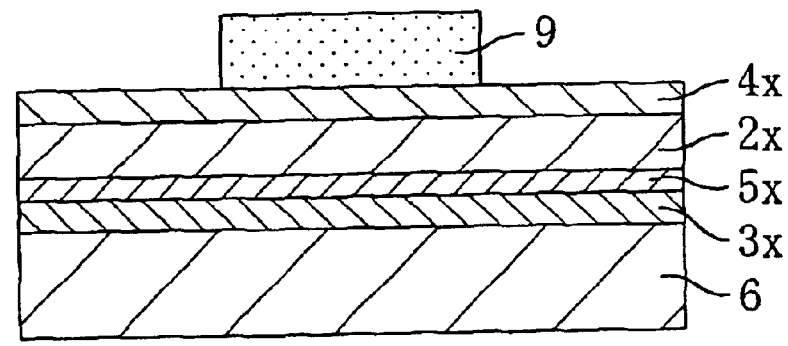

Then, in the step of FIG. 2D, a photolithography process is performed so as to form a resist film 9 on the noble metal film 4x.

Figure 2E:
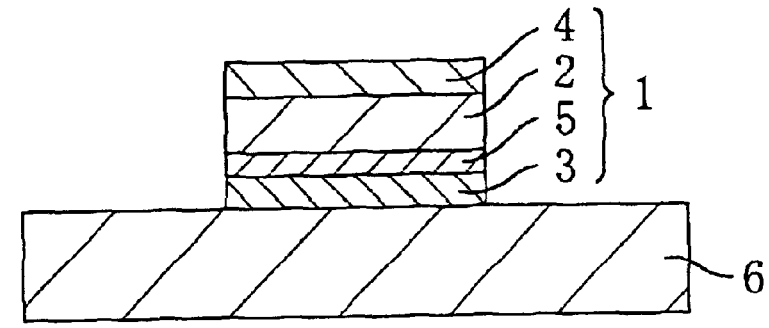

Then, in the step of FIG. 2E, the noble metal film 4x, the PZT film 2x, the PLT film 5x and the Pt film 3x are patterned using the resist film 9 as an etching mask so as to form the piezoelectric element 1 including the lower electrode 3, the base film 5, the piezoelectric film 2 and the upper electrode 4. This step is performed as follows.

First, the noble metal film 4x is etched so as to form the upper electrode 4. Methods for etching include a dry etching method, a wet etching method, etc. In the case of a dry etching method, an argon (Ar) gas is used for the etching. On the other hand, in the case of a wet etching method, a mixed liquid of potassium iodide (KI), iodine (I$_2$) and water (H$_2$O) is used for etching gold (Au).

When the upper electrode 4 is formed, the resist film 9 is once removed, and a resist film is formed again so as to provide an etching mask for the PZT film 2x. If the upper electrode 4 has the same shape as the PZT film, and the resist film 9 for the upper electrode 4 has a good wet etching resistance, the resist film 9 for the upper electrode 4 can be used, as it is, as an etching mask for patterning the PZT film 2x.

Then, the PZT film 2x and the PLT film 5x are etched so as to form the piezoelectric film 2 and the base film 5. A dry etching method is used if the thickness of the PZT film 2x, etc., is small, whereas a wet etching method is used if the thickness is large. When a dry etching method is used, the etching is performed by using an argon (Ar) gas as in the case of etching gold (Au) or platinum (Pt). When a wet etching method is used, the etching is performed by using an ammonium fluoride solution and hydrogen fluoride. The etching is performed by heating a buffered hydrogen fluoride solution in a beaker to about 60° C., and immersing the substrate 6 in the buffered hydrogen fluoride solution. The buffered hydrogen fluoride solution is continuously stirred so as to keep a constant concentration. After the etching is completed, the substrate 6 is washed with pure water, and then dried.

Then, the resist film used for the etching of the PZT film 2x, etc., is removed, and a resist film is formed again so as to provide an etching mask for the formation of the lower electrode. Then, the Pt film 3x is etched so as to from the lower electrode 3. When a dry etching method is used, the etching is performed by using an argon (Ar) gas. On the other hand, when a wet etching method is used, a mixed liquid of potassium cyanide, ammonium peroxosulfate and water is used as an etchant.

The following effects can be provided by the present embodiment.

In the prior art, in a case where a base film of (Pb,La)TiO$_3$ (PLT), PbTiO$_2$, or the like, is formed, it is necessary to form a base film such as a PLT film having a thickness of 5 nm to 30 nm by using a single crystal substrate such as an MgO single crystal substrate or an SrTiO$_3$ single crystal substrate, wherein a piezoelectric film such as a PZT film is epitaxially grown on the base film. However, since substrates such as an MgO single crystal substrate and an SrTiO$_3$ single crystal substrate are very expensive, it is difficult to reduce the cost of a piezoelectric element. Moreover, since the size of such a substrate is about 30 mm×30 mm, a substrate of a large area cannot be obtained.

In contrast, with the piezoelectric element and the manufacturing method therefor according to the present embodiment, it is possible to form a piezoelectric film having a good piezoelectric characteristic, as will be described later, while using a relatively inexpensive substrate such as a stainless steel substrate, a glass substrate or an Si substrate. Thus, it is possible to obtain a piezoelectric element having a good characteristic can be obtained at a low cost.

Moreover, among polycrystalline materials and amorphous materials, there are many of those that are flexible, unlike single crystal materials. Therefore, a piezoelectric element can be formed directly on a stainless steel plate, or the like, which is to be a component of various actuators, so as to realize a piezoelectric actuator which has a reduced size, an enhanced functionality and a reduced power consumption, and which is capable of a minute operation.

EXAMPLES

The following specific samples were subjected to a piezoelectric constant measurement in order to confirm the effects of the present embodiment. Samples having the structure as illustrated in FIG. 1 were produced while using various materials for the substrate 6 and eight values of 25 nm, 50 nm, 75 nm, 100 nm, 125 nm, 150 nm, 175 nm and 200 nm for the thickness of the base film 5 made of PLT, so as to determine changes in the piezoelectric constant $d_{31}$ in response to changes in the thickness of the base film.

An MgO single crystal substrate, a silicon single crystal substrate, a stainless steel substrate (polycrystalline), a polysilicon substrate, a heat-resistant glass substrate (amorphous), a titanium substrate (polycrystalline), an iron plate (polycrystalline), a copper plate (polycrystalline), and a nickel plate (polycrystalline) were used as the substrate 6.

Note that the lower electrode 3 is a Pt film having a thickness of 100 nm, the base film 5 is a PLT film having a composition of $Pb_{0.85}La_{0.15}Ti_{0.9625}O_x$, and the piezoelectric film 2 is a PZT film having a composition of $PbZr_{0.5}Ti_{0.5}O_3$ and a thickness of 3 µm. The base film 5 and the piezoelectric film 2 are formed by sputtering at a substrate temperature of 600° C. The upper electrode 4 is an Au film having a thickness of 200 nm which is formed by vapor deposition.

Figure 3:
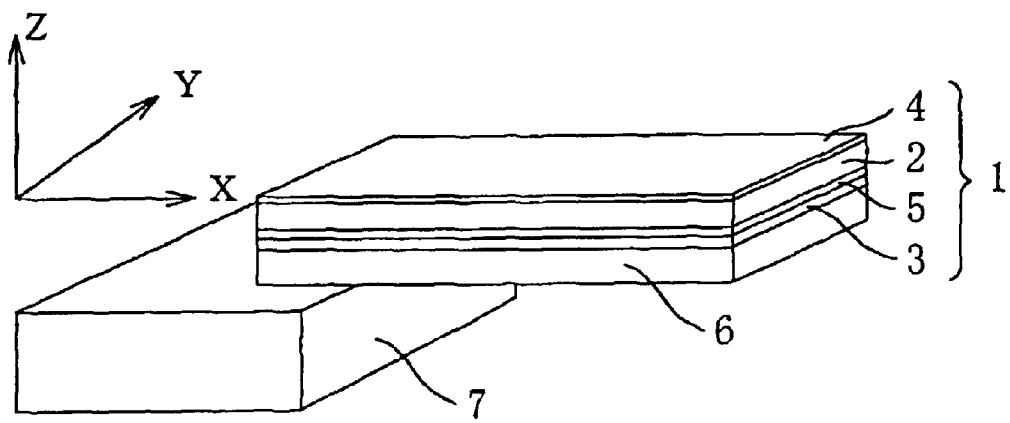
FIG. 3 is a perspective view schematically illustrating a method for measuring a piezoelectric constant with a laser displacement meter used in an experiment of the present invention.

FIG. 3 is a perspective view schematically illustrating a method for measuring a piezoelectric constant with a laser displacement meter used in this experiment. The piezoelectric element 1 and the substrate 6 were cut into a strip-shaped piece having a size of 3 mm×15 mm, with one longitudinal end thereof being fixed on a bedplate 7. In other words, the piezoelectric element 1 and the substrate 6 were cantilevered. In such a state, a voltage was applied between the upper electrode and the lower electrode, and a displacement was measured by using a laser displacement meter (not shown). The laser displacement meter may be a laser Doppler displacement meter manufactured by Graphtec.

In the coordinate system shown in FIG. 3, if the piezoelectric element 1 is stretched in the X direction, the amount of stretch dx of the piezoelectric element 1 in the X direction is expressed by Expression (1) below:

$$dx = \quad (1)$$
$$-3d_{31} \cdot S_1 \cdot S_2 \cdot t_1(t_1 + t_2) \cdot 1/(S_1^2 \cdot t_2^4 + 4S_1 \cdot S_2 \cdot t_1 \cdot t_2^3 + 6S_1 \cdot S_2 \cdot t_1^2 \cdot t_2^2 + 4S_1 \cdot S_2 \cdot t_2 \cdot t_1^3 + S_2 \cdot 2t_1^4)$$

where v(V) is the voltage, $t_1$(m) is the thickness of the piezoelectric film 2, $t_2$(m) is the thickness of the substrate 6, l(m) is the length of the piezoelectric film 2, $S_1$ is the mechanical coupling coefficient of the piezoelectric film 2, $S_2$ is the mechanical coupling coefficient of the substrate 6, and $d_{31}$ is the piezoelectric constant of the piezoelectric film 2. In view of this, the piezoelectric constant $d_{31}$ was calculated by substituting the values of the various constants into Expression (1).

Figure 4:
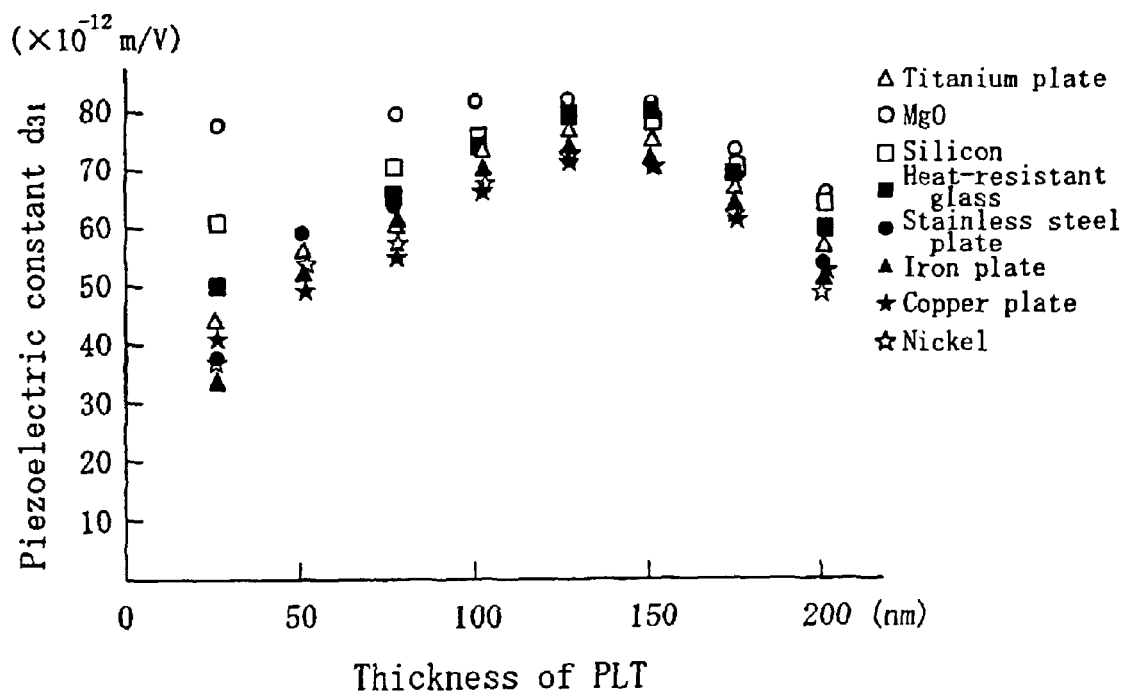
FIG. 4 is a graph illustrating experimental data of the piezoelectric constant $d_{31}$ measured for eight different thicknesses of a base film using various substrates according to the first embodiment of the present invention.

FIG. 4 is a graph illustrating experimental data of the piezoelectric constant $d_{31}$ measured for eight different thicknesses of the base film using various substrates. As illustrated in FIG. 4, it has been found that a satisfactory piezoelectric constant $d_{31}$ can be obtained if the thickness of the base film 5 is equal to or greater than 50 nm and less than or equal to 200 nm, not only when using an MgO single crystal substrate but also when using a polycrystalline substrate or an amorphous substrate. Particularly, it has been found that if the thickness of the base film 5 is equal to or greater than 100 nm and less than or equal to 150 nm, the piezoelectric constant $d_{31}$ is very high, and there is only a little decrease in the piezoelectric constant $d_{31}$ with respect to that when using an MgO substrate (about 80×10$^{-12}$ m/V).

Thus, it can be seen that with the piezoelectric element and the manufacturing method therefor according to the present embodiment, it is possible to form a piezoelectric element having a good characteristic while using a relatively inexpensive substrate such as a stainless steel substrate, a glass substrate or an Si substrate.

It is believed that a good piezoelectric characteristic cannot be obtained in the prior art with a piezoelectric film using a substrate other than a single crystal substrate (a polycrystalline substrate or an amorphous substrate) because the thickness of the base film is about 30 nm at most as in the case of forming a piezoelectric film on a single crystal substrate. In contrast, it has been found in the present invention that a piezoelectric film having a good orientation and a good piezoelectric characteristic can be formed on a polycrystalline substrate or an amorphous substrate by setting the thickness of the base film to be equal to or greater than 50 nm and less than or equal to 200 nm.

A piezoelectric film can be formed on a substrate other than a single crystal substrate, whereby in a case where a piezoelectric element is provided in an actuator or various devices, it is possible to provide the piezoelectric element directly on a component of an actuator or various devices. For example, it is clear from the manufacturing steps of FIG. 2A to FIG. 2D that the lower electrode, the base film, the piezoelectric film, the upper electrode, etc., can be formed on a stainless steel spring, etc., of an actuator. Therefore, it is possible to reduce the cost by eliminating the need for a single crystal substrate and by simplifying the manufacturing process, as compared to a method where an expensive single crystal substrate (MgO substrate) is used as a consumable, as in a case where a conventional transfer method is used.

Note however that it is possible to use a transfer method in the present invention. For example, a polysilicon substrate can be removed after a piezoelectric element is formed on the inexpensive polysilicon substrate. Also in such a case, the manufacturing cost can be reduced because a polysilicon substrate is considerably less expensive than an MgO substrate.

In such a case, a single crystal silicon wafer may be used. There are some single crystal substrates that are not well lattice-matched with a piezoelectric film having a perovskite structure. With such a substrate, a good characteristic cannot be obtained if a piezoelectric film is formed on a thin base film (having a thickness of 3 nm to 30 nm, for example) as in the case of a substrate (e.g., an MgO substrate) that is well lattice-matched with a piezoelectric film having a perovskite structure. However, it is possible to obtain a piezoelectric element having a good piezoelectric characteristic by forming a piezoelectric film on a base film having a thickness that is equal to or greater than 50 nm and less than or equal to 200 nm, as in the present invention.

In the present invention, the piezoelectric film 2 is preferably made of a piezoelectric material having a perovskite structure, and more preferably made of a perovskite-type oxide, including lead (Pb), titanium (Ti) and zirconium (Zr), or a perovskite oxide, including barium (Ba) and titanium (Ti).

In the present invention, the lower electrode 3 is preferably made of a metal material that is capable of withstanding the oxidative atmosphere during the formation of an oxide of perovskite, or the like, and more preferably made of a metal selected from platinum (Pt), palladium (Pd), iridium (Ir) and ruthenium (Ru), or an oxide thereof.

In the present invention, the base film 5 is preferably made of an oxide material having a tetragonal or cubic crystalline structure, which is suitable for the growth of a perovskite film, and more preferably made of an oxide material having a perovskite structure with no Zr. Specifically, preferred materials include lead titanate ($PbTiO_3$), and (Pb,La)$TiO_3$ (hereinafter abbreviated as "PLT") obtained by adding lanthanum to $PbTiO_3$. The base film may be made of other oxide materials having a tetragonal or cubic crystalline structure, such as magnesium oxide (MgO), strontium titanate ($SrTiO_3$), barium titanate ($BaTiO_3$), strontium ruthenate ($SrRuO_3$), nickel oxide (NiO), cobalt oxide (CoO), titanium oxide ($TiO_2$), zinc oxide (ZnO), and zirconium oxide ($ZrO_2$).

Moreover, the thickness of the base film 5 is preferably equal to or greater than 50 nm and less than or equal to 200 nm. This is because if the thickness of the base film is less than 50 nm, a sufficient piezoelectric coefficient cannot be obtained in the piezoelectric film 2 formed on the base film 5, as illustrated in FIG. 4, assumedly due to a poor orientation. Moreover, it has been found that if the thickness of the base film 5 is over 200 nm, the piezoelectric coefficient of the piezoelectric film 2 deteriorates, assumedly due to the rigidity of the base film 5 becoming excessively high. Moreover, as illustrated in FIG. 4, the thickness of the base film 5 is more preferably equal to or greater than 100 nm and less than or equal to 150 nm in order to provide an even better piezoelectric characteristic.

In the present invention, the upper electrode 4 is preferably made of a metal material that is capable of withstanding an oxidative atmosphere, and more preferably made of a metal selected from platinum (Pt), palladium (Pd), iridium (Ir), ruthenium (Ru) and gold (Au), or an oxide thereof.

In the present invention, it is preferred that a substrate other than a single crystal substrate is used as the substrate 6. For example, where materials in general are classified into the three categories of single crystal materials, polycrystalline materials and amorphous materials, a substrate used in the present invention is preferably a polycrystalline substrate or an amorphous substrate. Specifically, preferred materials of the substrate 6 include a metal such as iron (Fe), copper (Cu), cobalt (Co), nickel (Ni), tantalum (Ta), titanium (Ti) and chromium (Cr), an alloy containing one or more of these metals, and an oxide of such a metal or an alloy. Examples of such an alloy or an oxide include a stainless steel, a titanium alloy, and a heat-resistant glass. Moreover, other preferred materials of the substrate 6 include a semiconductor whose main component is carbon (C) or silicon (Si), and an oxide thereof.

Note however that even with a single crystal substrate that is not well lattice-matched with a piezoelectric film, it is possible to obtain a piezoelectric element having a good piezoelectric characteristic by using the present invention.

Other Examples

Figure 5:
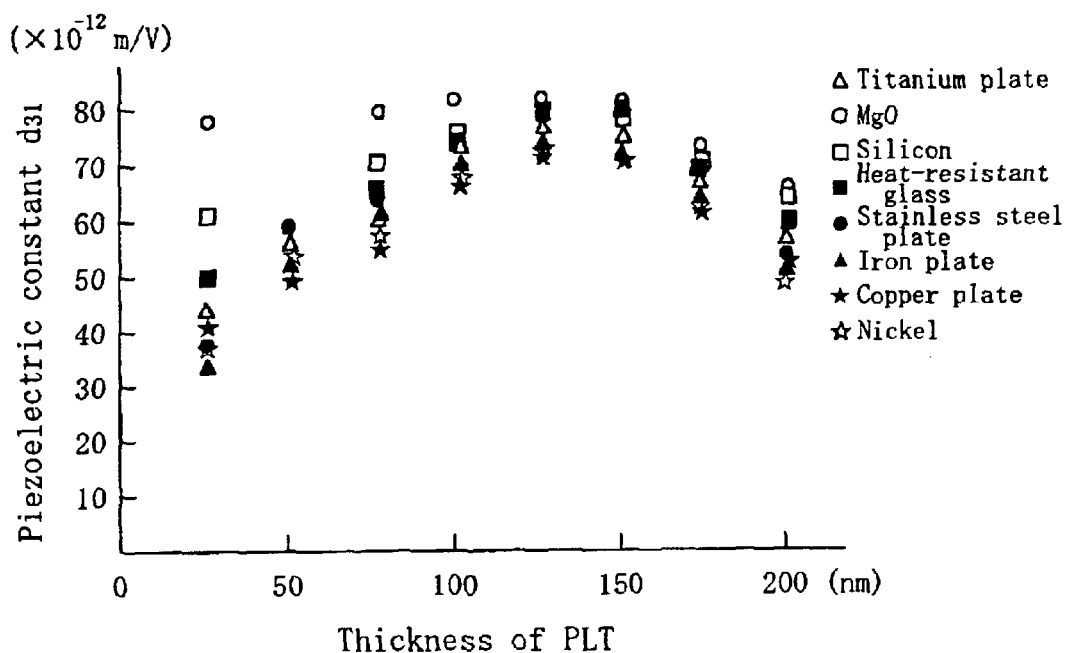
FIG. 5 is a graph illustrating experimental data of the piezoelectric constant $d_{31}$ measured for eight different thicknesses of a base film using various substrates, wherein the base film is formed after forming an amorphous silicon film on the substrate, according to an example of the first embodiment of the present invention.

FIG. 5 is a graph illustrating experimental data of the piezoelectric constant $d_{31}$ measured for eight different thicknesses of a base film using various substrates, wherein the base film is formed after forming an amorphous silicon film on the substrate. The amorphous silicon film has a thickness of about 300 nm, and is formed by a CVD method. Eight values of 25 nm, 50 nm, 75 nm, 100 nm, 125 nm, 150 nm, 175 nm and 200 nm are used for the thickness of the base film 5 made of PLT.

An MgO single crystal substrate, a stainless steel substrate (polycrystalline), a silicon substrate (single crystal or polycrystalline), a heat-resistant glass substrate (amorphous), a titanium substrate (polycrystalline), an iron plate (polycrystalline), a copper plate (polycrystalline), and a nickel plate (polycrystalline) were used as the substrate 6.

The lower electrode 3 is a Pt film having a thickness of 100 nm, the base film 5 is a PLT film having a composition of $Pb_{0.85}La_{0.15}Ti_{0.9625}O_x$, and the piezoelectric film 2 is a PZT film having a composition of $PbZr_{0.5}Ti_{0.5}O_3$ and a thickness of 3 μm. The base film 5 and the piezoelectric film 2 are formed by sputtering at a substrate temperature of 600° C. The upper electrode 4 is an Au film having a thickness of 200 nm which is formed by vapor deposition.

The piezoelectric element 1 and the substrate 6 were cut into a strip-shaped piece having a size of 3 mm×15 mm, and were cantilevered as illustrated in FIG. 3. In such a state, a voltage was applied between the upper electrode and the lower electrode, and a displacement was measured by using a laser displacement meter (not shown).

As illustrated in FIG. 5, it has been found also in this example that a satisfactory piezoelectric constant $d_{31}$ can be obtained if the thickness of the base film 5 is equal to or greater than 50 nm and less than or equal to 200 nm, not only when using an MgO single crystal substrate but also when using a polycrystalline substrate or an amorphous substrate. Particularly, if the thickness of the base film 5 is equal to or greater than 100 nm and less than or equal to 150 nm, the piezoelectric constant $d_{31}$ is very high, and there is only a little decrease in the piezoelectric constant $d_{31}$ with respect to that when using an MgO substrate (about $80 \times 10^{-12}$ m/V).

Thus, it can be seen that with the piezoelectric element and the manufacturing method therefor of the present invention, it is possible to form a piezoelectric element having a good piezoelectric characteristic while using a relatively inexpensive substrate such as a stainless steel substrate, a glass substrate or an Si substrate, even with an amorphous silicon film, or the like, being provided thereon.

Figure 6:
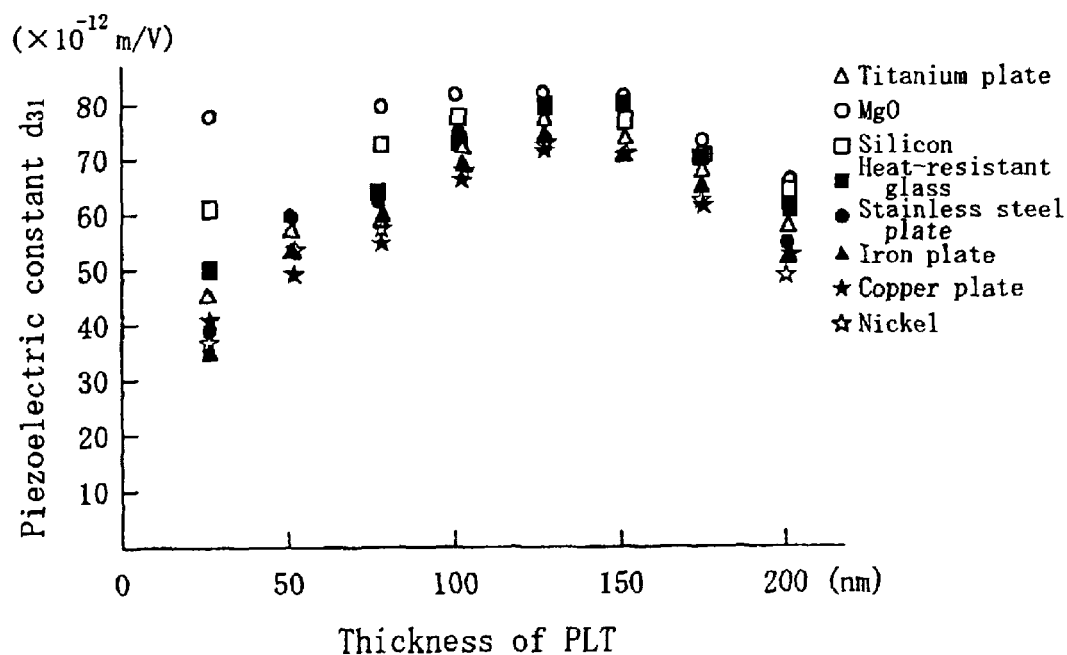
FIG. 6 is a graph illustrating experimental data of the piezoelectric constant $d_{31}$ measured for eight different thicknesses of a base film using various substrates, wherein the base film is formed after forming a polycrystalline silicon film on the substrate, according to an example of the first embodiment of the present invention.

FIG. 6 is a graph illustrating experimental data of the piezoelectric constant $d_{31}$ measured for eight different thicknesses of a base film using various substrates, wherein the base film is formed after forming a polycrystalline silicon film on the substrate. The polycrystalline silicon film has a thickness of about 300 nm, and is formed by a CVD method. Eight values of 25 nm, 50 nm, 75 nm, 100 nm, 125 nm, 150 nm, 175 nm and 200 nm are used for the thickness of the base film 5 made of PLT.

An MgO single crystal substrate, a stainless steel substrate (polycrystalline), a silicon substrate (polycrystalline), a heat-resistant glass substrate (amorphous), a titanium substrate (polycrystalline), an iron plate (polycrystalline), a copper plate (polycrystalline), and a nickel plate (polycrystalline) were used as the substrate 6.

The lower electrode 3 is a Pt film having a thickness of 100 nm to 120 nm, the base film 5 is a PLT film having a composition of $Pb_{0.85}La_{0.15}Ti_{0.9625}O_x$, and the piezoelectric film 2 is a PZT film having a composition of $PbZr_{0.5}Ti_{0.5}O_3$ and a thickness of 3 μm. The base film 5 and the piezoelectric film 2 are formed by sputtering at a substrate temperature of 600° C. The upper electrode 4 is an Au film having a thickness of 200 nm which is formed by vapor deposition.

The piezoelectric element 1 and the substrate 6 were cut into a strip-shaped piece having a size of 3 mm×15 mm, and were cantilevered as illustrated in FIG. 3. In such a state, a voltage was applied between the upper electrode and the lower electrode, and a displacement was measured by using a laser displacement meter (not shown).

As illustrated in FIG. 6, it has been found also in this example that a satisfactory piezoelectric constant $d_{31}$ can be obtained if the thickness of the base film 5 is equal to or greater than 50 nm and less than or equal to 200 nm, not only when using an MgO single crystal substrate but also when using a polycrystalline substrate or an amorphous substrate. Particularly, if the thickness of the base film 5 is equal to or greater than 100 nm and less than or equal to 150 nm, the piezoelectric constant $d_{31}$ is very high, and there is only a little decrease in the piezoelectric constant $d_{31}$ with respect to that when using an MgO substrate (about $80 \times 10^{-12}$ mN/V).

Thus, it can be seen that with the piezoelectric element and the manufacturing method therefor of the present invention, it is possible to form a piezoelectric element having a good piezoelectric characteristic while using a relatively inexpensive substrate such as a stainless steel substrate, a glass substrate or an Si substrate.

Figure 7:
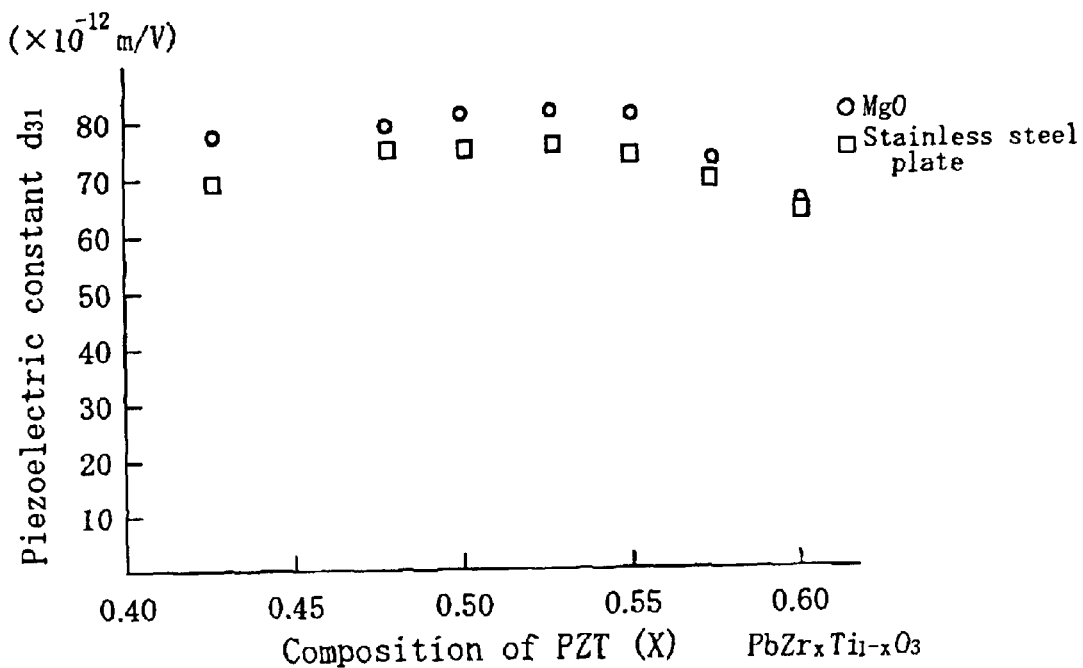
FIG. 7 is a graph illustrating experimental data of the piezoelectric constant $d_{31}$ measured for different Zr composition ratios in a PZT film, wherein the PZT film is a piezoelectric film formed on a base film which is formed on a stainless steel substrate, according to an example of the first embodiment of the present invention.

FIG. 7 is a graph illustrating experimental data of the piezoelectric constant $d_{31}$ measured for different Zr composition ratios in a PZT film, wherein the PZT film is a piezoelectric film formed on a base film which is formed on a stainless steel substrate.

Seven different values in the range of 0.40 to 0.60 were used for the Zr composition ratio x of PZT ($PbZr_xTi_{1-x}O_3$). The thickness of the piezoelectric film (PZT film) is about 3 $\mu$m. A stainless steel substrate (polycrystalline) and an MgO single crystal substrate were used as the substrate 6.

The lower electrode 3 is a Pt film having a thickness of 100 nm, the base film 5 is a PLT film having a composition of $Pb_{0.85}La_{0.15}Ti_{0.9625}O_x$ and a thickness of about 100 nm to 120 nm, and the base film 5 and the piezoelectric film 2 are formed by sputtering at a substrate temperature of 600° C. The upper electrode 4 is an Au film having a thickness of 200 nm which is formed by vapor deposition.

The piezoelectric element 1 and the substrate 6 were cut into a strip-shaped piece having a size of 3 mm×15 mm, and were cantilevered as illustrated in FIG. 3. In such a state, a voltage was applied between the upper electrode and the lower electrode, and a displacement was measured by using a laser displacement meter (not shown).

It has been found that in a case where a stainless steel substrate is used, it is possible to obtain a good piezoelectric constant $d_{31}$ that is generally constant and generally equal to that when an MgO single crystal substrate is used, even with the composition ratio x of PZT varying in the range of 0.40 to 0.60, as illustrated in FIG. 7.

Thus, it can be seen that with the piezoelectric element and the manufacturing method therefor of the present invention, it is possible to form a piezoelectric element having a good piezoelectric characteristic while using a relatively inexpensive substrate such as a stainless steel substrate, a glass substrate or an Si substrate.

Figure 8:
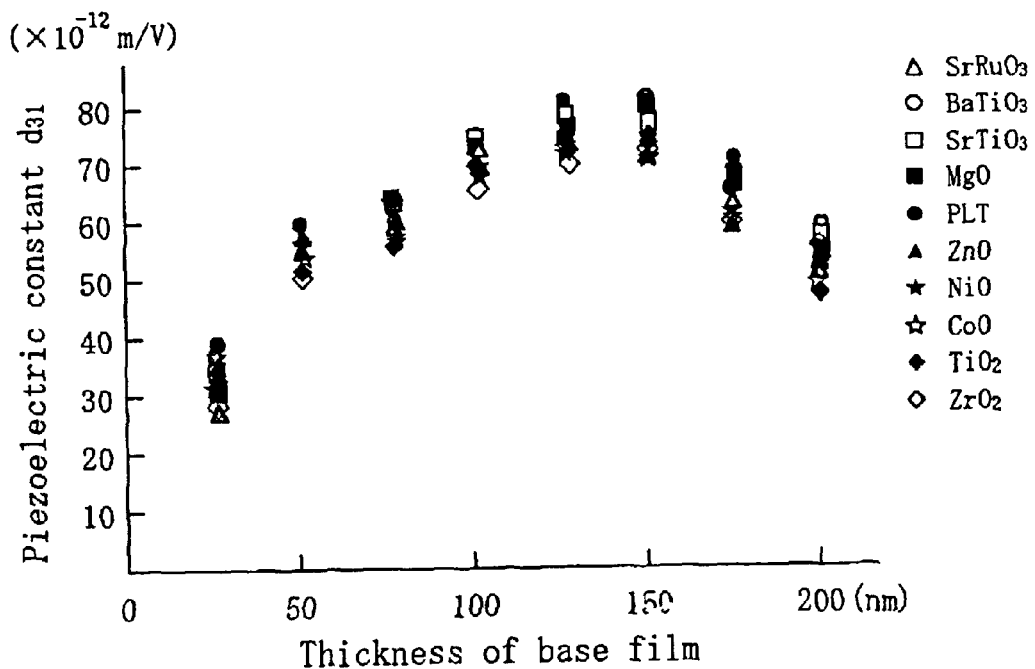
FIG. 8 is a graph illustrating experimental data of the piezoelectric constant $d_{31}$ measured for ten different materials of a base film formed on a stainless steel substrate according to an example of the first embodiment of the present invention.

FIG. 8 is a graph illustrating experimental data of the piezoelectric constant $d_{31}$ measured for ten different materials of a base film formed on a stainless steel substrate.

The following ten materials were used for the base film 5: PLT having a composition of $Pb_{0.85}La_{0.15}Ti_{0.9625}O_x$; magnesium oxide (MgO); strontium titanate ($SrTiO_3$); barium titanate ($BaTiO_3$); strontium ruthenate ($SrRuO_3$); nickel oxide (NiO); cobalt oxide (CoO); titanium oxide ($TiO_2$); zinc oxide (ZnO); and zirconium oxide ($ZrO_2$). Moreover, eight values of 25 nm, 50 nm, 75 nm, 100 nm, 125 nm, 150 nm, 175 nm and 200 nm are used for the thickness of the base film 5.

The piezoelectric film 2 is a PZT ($PbZr_{0.5}Ti_{0.5}O_3$) film having a thickness of 3 $\mu$m which is formed by sputtering.

The lower electrode 3 is a Pt film having a thickness of 100 nm to 120 nm which is formed by sputtering, the base film 5 is a PLT film having a composition of $Pb_{0.85}La_{0.15}Ti_{0.9625}O_x$ and a thickness of about 100 nm to 120 nm, and the base film 5 and the piezoelectric film 2 are formed by sputtering at a substrate temperature of 600° C. The upper electrode 4 is an Au film having a thickness of 200 nm which is formed by vapor deposition.

The piezoelectric element 1 and the substrate 6 were cut into a strip-shaped piece having a size of 3 mm×15 mm, and were cantilevered as illustrated in FIG. 3. In such a state, a voltage was applied between the upper electrode and the lower electrode, and a displacement was measured by using a laser displacement meter (not shown).

As illustrated in FIG. 8, it has been found that a satisfactory piezoelectric constant $d_{31}$ can be obtained if the thickness of the base film 5 is equal to or greater than 50 nm and less than or equal to 200 nm, as long as the base film has a cubic or tetragonal crystalline structure. Particularly, it has been found that if the thickness of the base film 5 is equal to or greater than 100 nm and less than or equal to 150 nm, the piezoelectric constant $d_{31}$ is very high.

Thus, it can be seen that with the piezoelectric element and the manufacturing method therefor of the present invention, it is possible to form a piezoelectric element having a good piezoelectric characteristic.

Second Embodiment

FIG. 9A to FIG. 9D are cross-sectional views illustrating various structures of a piezoelectric actuator according to the second embodiment of the present invention.

The actuator of the present embodiment includes, as basic components, the piezoelectric element 1, a reinforcement member 14 made of a synthetic resin and provided so as to hold the piezoelectric element 1, a fixed portion 15 for supporting the reinforcement member 14, an upper electrode extraction line 16 filling a through hole 17 formed in the reinforcement member 14 so as to be connected to the upper electrode 4 of the piezoelectric element 1, and an object 18 to be driven by the piezoelectric element 1. Moreover, the reinforcement member 14 connects the fixed portion 15, the object 18 and the piezoelectric element 1 together, and thus includes a portion that functions as a moving member and a portion that functions as a fixed member.

The piezoelectric element 1 has a structure as described above in the first embodiment, and includes the lower electrode 3, the base film 5 formed on the lower electrode 3, the piezoelectric film 2 formed on the base film 5, and the upper electrode 4 formed on the piezoelectric film 2. The material and the thickness of each of the components 2 to 5 of the piezoelectric element 1 may suitably be selected within the range described above in the first embodiment. For example, the lower electrode 3 is a Pt film having a thickness of 100 nm, the base film 5 is a PLT film having a composition of $Pb_{0.85}La_{0.15}Ti_{0.9625}O_x$ and a thickness of 150 nm, the piezoelectric film 2 is a PZT film having a composition of $PbZr_{0.5}Ti_{0.5}O_3$ and a thickness of 3 $\mu$m, and the upper electrode 4 is an Au film having a thickness of 200 nm.

One end of the piezoelectric element 1 is fixed to the fixed portion 15 via the lower electrode 3. When the fixed portion 15 is a conductive member, the lower electrode 3 is connected to a voltage supply section via the fixed portion 15. When the fixed portion 15 is an insulative member, the lower electrode 3 is connected to the voltage supply section via an extraction line provided on the fixed portion 15. Since the reinforcement member 14 is an insulative layer, the upper electrode 4 is connected to the upper electrode extraction line 16 passing through the through hole 17. The object 18 to be operated by the piezoelectric element 1 is attached to an end portion of the piezoelectric element 1 that is opposite to the other end portion being in contact with the fixed portion 15.

Figure 9A:
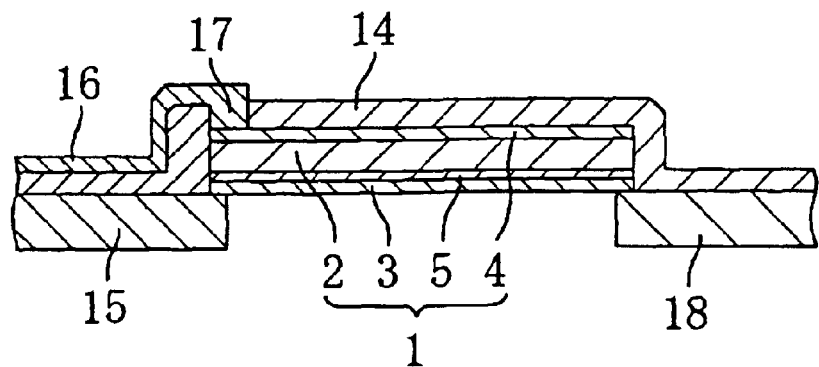
FIG. 9A to FIG. 9D are cross-sectional views illustrating various structures of a piezoelectric actuator according to the second embodiment of the present invention.

In the structure illustrated in FIG. 9A, the substrate used for forming the piezoelectric element 1 has been removed by a method such as etching. Thus, only the reinforcement member 14 has the shape retaining function.

Figure 9B:
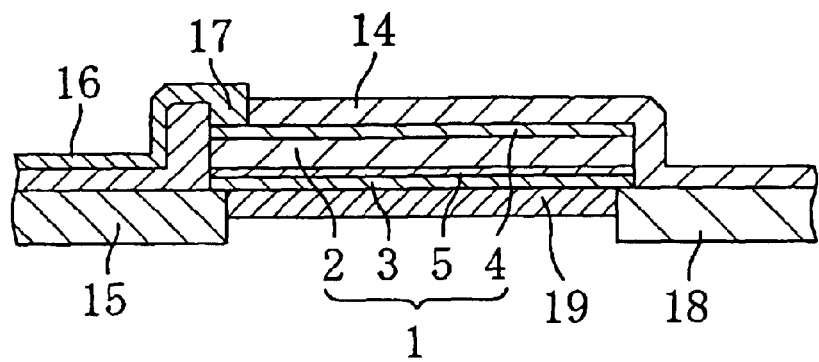

In the structure illustrated in FIG. 9B, the substrate used for forming the piezoelectric element 1 has been removed by a method such as etching, with a protection layer 19 for covering the lower electrode 3 of the piezoelectric element 1 being provided in the area from which the substrate has been removed. Thus, the protection layer 19 and the reinforcement member 14 have the shape retaining function.

Figure 9C:
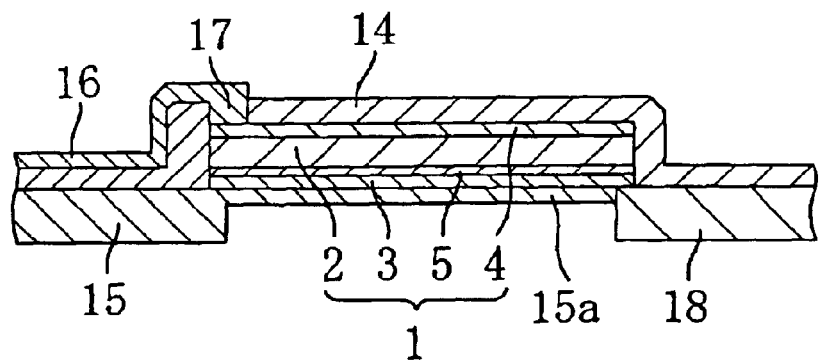

In the structure illustrated in FIG. 9C, the substrate used for forming the piezoelectric element 1 has been thinned by a method such as etching so as to leave only a portion 15a. Thus, the reinforcement member 14 and the portion 15a of the substrate have the shape retaining function.

Figure 9D:
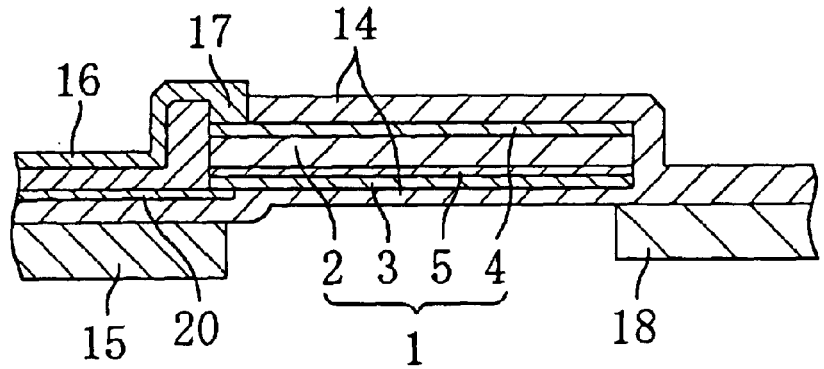

In the structure illustrated in FIG. 9D, the substrate used for forming the piezoelectric element 1 has been removed by a method such as etching, with the reinforcement member 14 covering the entire piezoelectric element 1 and reaching an area on the fixed portion 15. This is an example of a structure that is suitable in a case where it is desired to apply a voltage directly to the lower electrode 3, whether the fixed portion is an insulative member or a conductive member. FIG. 9D illustrates a case where the fixed portion 15 is a conductive member, in which case a lower electrode extraction line 20 is formed on a portion of the reinforcement member 14 that is located on the fixed portion 15. When the fixed portion 15 is an insulative member, the lower electrode extraction line 20 may be formed on the fixed portion 15, with the reinforcement member 14 being not formed in the area on the fixed portion 15.

FIG. 10A to FIG. 10E are cross-sectional views illustrating some steps in a method for manufacturing an actuator according to the present embodiment.

Figure 10A:
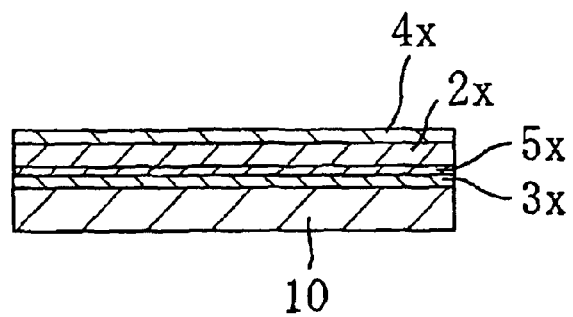
FIG. 10A to FIG. 10E are cross-sectional views illustrating some steps in a method for manufacturing an actuator according to the second embodiment of the present invention.

First, in the step of FIG. 10A, the Pt film 3x to be the lower electrode 3, the PLT film 5x to be the base film 5, the PZT film 2x to be the piezoelectric film 2, and the noble metal film 4x to be the upper electrode 4 are formed, by the method described above in the first embodiment, on a substrate 10 that can be made into the fixed portion 15 or the object 18.

Figure 10B:
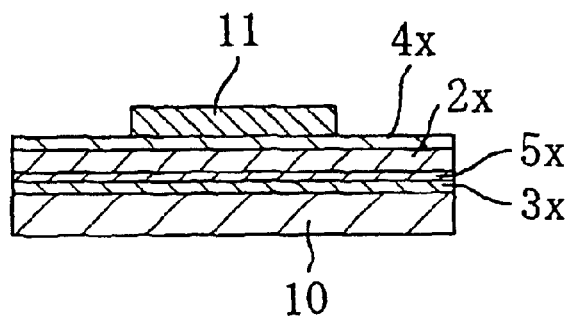

Then, in the step of FIG. 10B, a photolithography process is performed so as to form a resist mask 11 on the noble metal film 4x.

Figure 10C:
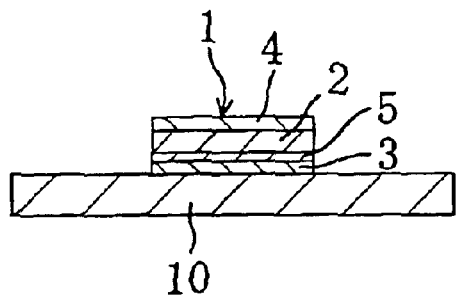

Then, in the step of FIG. 10C, the noble metal film 4x, the PZT film 2x, the PLT film 5x and the Pt film 3x are patterned so as to form the piezoelectric element 1 including the lower electrode 3, the base film 5, the piezoelectric film 2 and the upper electrode 4. The patterning method is as described above in the first embodiment.

Figure 10D:
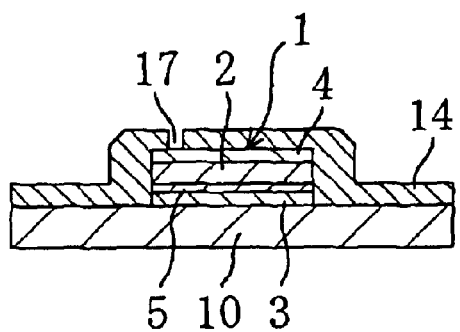

Then, in the step of FIG. 10D, the reinforcement member 14 made of a synthetic resin is applied on the substrate 10 and the upper electrode 4 by using a spinner method, a roll method, an immersion method, a spray method, an inkjet method, or the like. Then, a photolithography process and an etching process are performed so as to open the through hole 17 for extracting the upper electrode 4 to the reinforcement member 14.

Figure 10E:
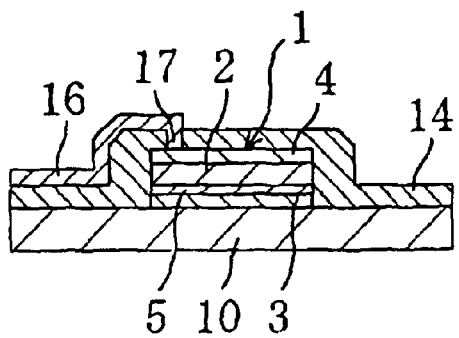

Then, in the step of FIG. 10E, a plating process is performed so as to fill the through hole 17 while forming a metal film made of an aluminum alloy, or the like, covering the reinforcement member 14, after which the metal film is patterned so as to form the upper electrode extraction line 16.

The steps shown in FIG. 10A to FIG. 10E provide a method that can be used for realizing any of the structures illustrated in FIG. 9A to FIG. 9C.

Specifically, the structure illustrated in FIG. 9A can be obtained from the structure illustrated in FIG. 10E by removing a portion of the substrate 10 that is located under the piezoelectric element 1 so as to leave only the opposite end portions thereof In this way, the substrate 10 is divided into the fixed portion 15 and the object 18.

Moreover, the structure illustrated in FIG. 9B can be obtained from the structure illustrated in FIG. 10E by removing a portion of the substrate 10 that is located under the piezoelectric element 1 so as to leave only the opposite end portions thereof, and then forming the protection layer 19.

Furthermore, the structure illustrated in FIG. 9C can be obtained from the structure illustrated in FIG. 10E by half-etching a portion of the substrate 10 that is located under the piezoelectric element 1 except for the opposite end portions thereof.

Note that the structure illustrated in FIG. 9D can be easily obtained by employing a method disclosed in Japanese Laid-Open Patent Publication No. 2001-309673 on an invention by the present inventors.

Figure 11:
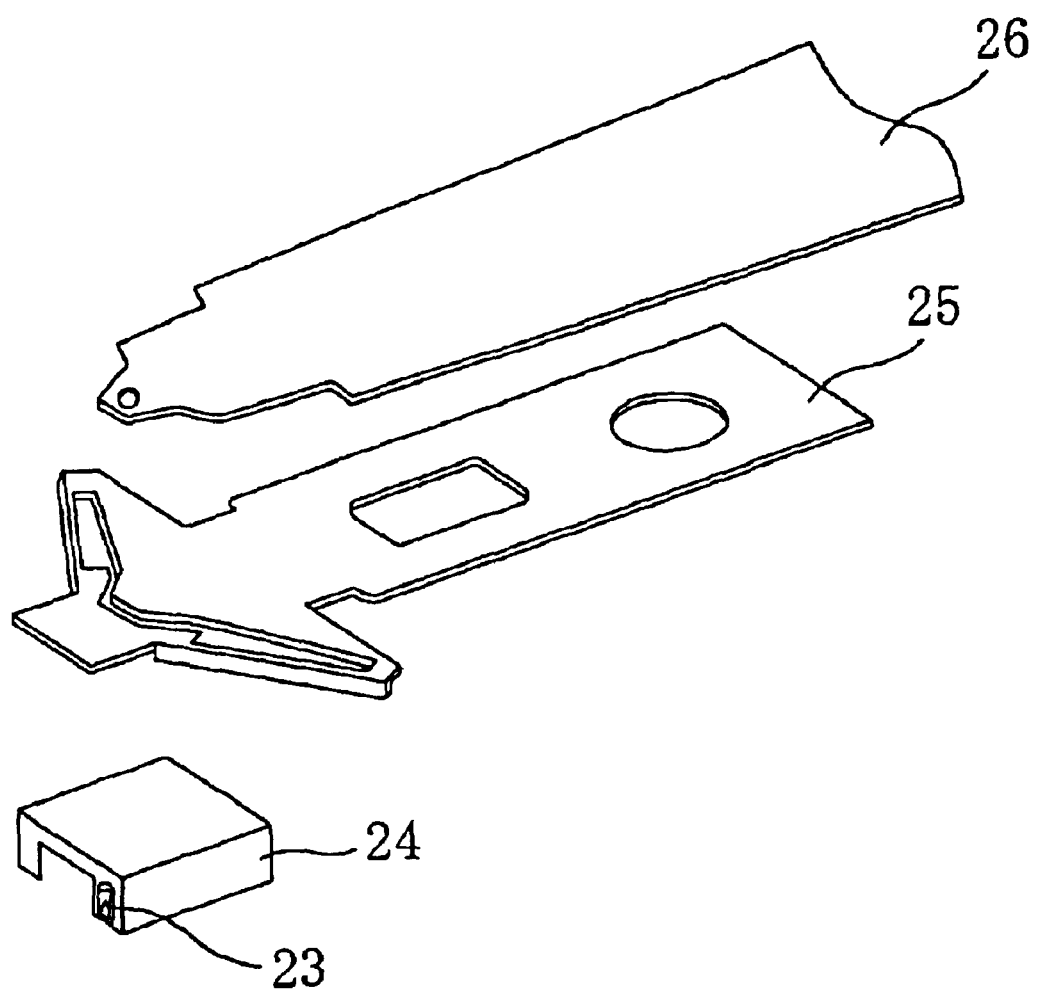
FIG. 11 is a perspective view illustrating a basic structure of a two-stage actuator, which is an example of the actuator of the second embodiment of the present invention.
Figure 12A:
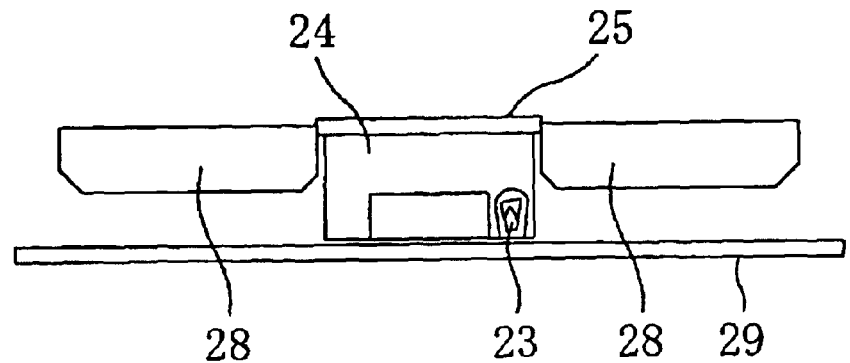
FIG. 12A and FIG. 12B are a front view and a plan view, respectively, illustrating a two-stage actuator in a data recording/reproducing apparatus.
Figure 12B:
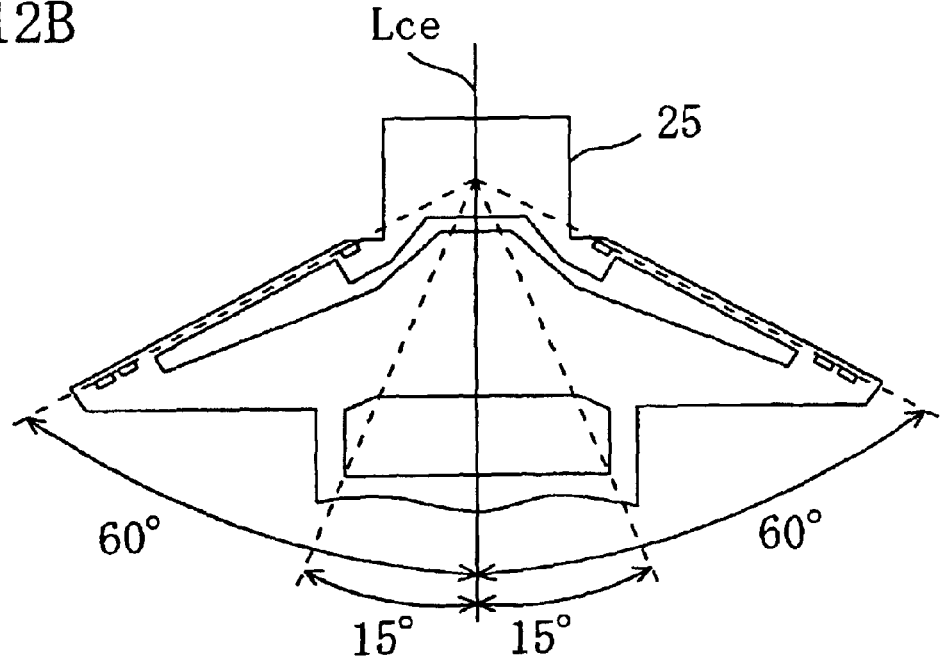

FIG. 11 is a perspective view illustrating a basic structure of a two-stage actuator for a data recording/reproducing apparatus, which is an example of the actuator of the second embodiment of the present invention. FIG. 12A and FIG. 12B are a front view and a plan view, respectively, illustrating the two-stage actuator.

As illustrated in FIG. 11 and FIG. 12A, a head supporting mechanism includes a slider 24 having a head element 23 mounted thereon for flying or sliding over a rotating or running recording medium, a suspension 25 for supporting the slider 24, a base plate 26 to which the suspension 25 is fixed, a load beam (not shown) and the head element 23 for applying a load on the slider 24, and a signal processing system (not shown) for electrically coupling together the recoding/reproducing circuits of the data recording apparatus. The two-stage actuator is connected, on a printed circuit, directly or indirectly to the signal processing system lead line or the suspension.

A minutely-driving actuator, which is integrated with the suspension 25, is provided between the slider 24 having the head element 23 thereon and the base plate 26.

The actuator includes a stainless steel base member having a size of about 10 to 30 μm, and a piezoelectric film that forms minutely-driving elements 28. Each minutely-driving element 28 including a piezoelectric element is bent so as to be perpendicular to a disk surface 29.

Furthermore, as illustrated in FIG. 12B, each minutely-driving element 28 is arranged to be at an angle of 15 degrees or more with respect to a plane that is perpendicular to the disk surface 29 and along the longitudinal center line Lce of the suspension 25.

Figure 13A:
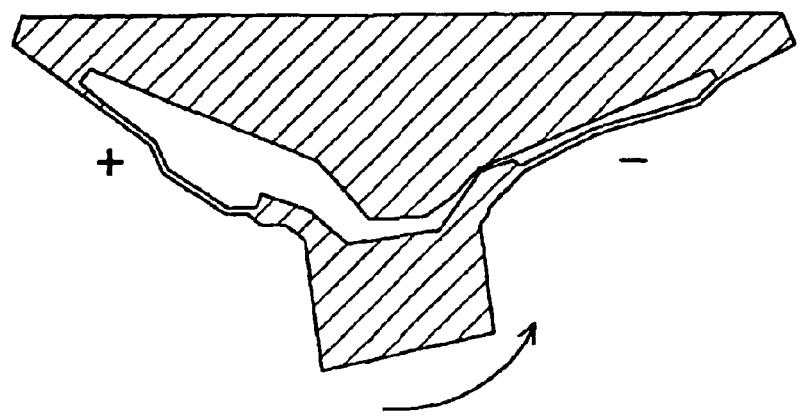
FIG. 13A and FIG. 13B are plan views illustrating a movement of a suspension, etc., caused by a minutely-driving element in a two-stage actuator.
Figure 13B:
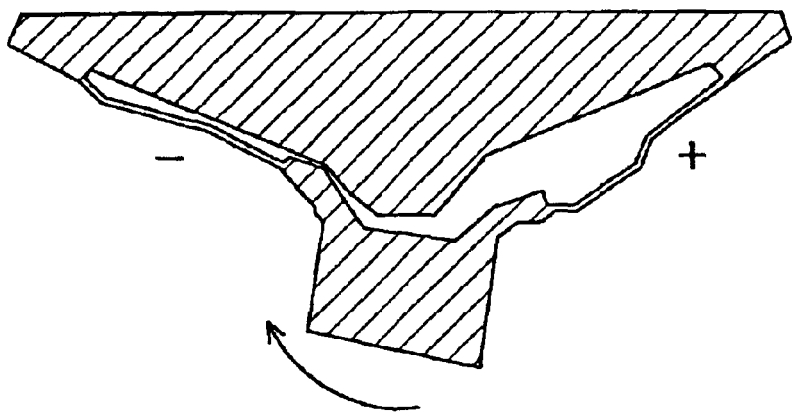

FIG. 13A and FIG. 13B are plan views illustrating a movement of a suspension, etc., caused by a minutely-driving element. Driving voltages of 90-degree reverse phases are applied to the minutely-driving elements 28 for repeatedly expanding/contracting the minutely-driving elements 28. Through the expansion/contraction, the suspension 25, together with the slider 24 and the head element 23 which are fixed to the suspension 25, is turned as illustrated in FIG. 13A. Then, the phases of the driving voltages are reversed, whereby the suspension 25, together with the slider 24 and the head element 23 which are fixed to the suspension 25, is turned in the opposite direction as illustrated in FIG. 13B.

Each minutely-driving element 28 is arranged to be at an angle of 15 degrees or more with respect to the plane perpendicular to the disk surface 29 (the center line Lce illustrated in FIG. 12A). This is for reducing the influence from the disk rotation on the slider 24 (the viscous resistance of the air), which is increased if the angle is small (greater than about 0 degree and less than about 15 degrees). Such a structure as described above enables tracking with a high precision.

Note that while a stainless steel is used as the base member of the actuator in the structure described above, the base member may be of any material as long as it possesses a spring property and a heat resistance and as long as a satisfactory rigidity can be ensured even with a small thickness.

In the prior art, an actuator as that of the present embodiment is obtained by forming the piezoelectric element 1 on a single crystal substrate of MgO, or the like, processing the piezoelectric element 1 by photolithography, and then transferring it to a fixed member by a transfer process. In the transfer process, the piezoelectric element 1 and a supporting member are fixed together via an adhesive or a metal junction. However, the fixing operation using an adhesive or a metal junction complicates the process. Moreover, when fixing the piezoelectric element 1, such a fixing operation may possibly lead to a positional error or an inclination with respect to the surface to which it is attached.

In contrast, according to the present embodiment, the piezoelectric element 1 can be formed directly on a flexible metal plate such as a stainless steel plate or an insulative plate (polycrystalline or amorphous) by the method described above in the first embodiment, thereby eliminating the need to perform the transfer operation using adhesion or metal junction. Therefore, it is possible to reduce the manufacturing cost by eliminating the need for separately providing an expensive single crystal substrate such as an MgO substrate, to reduce the manufacturing cost by simplifying the process, and to improve the mechanical precision and the functionality. Particularly, it is possible to realize an actuator having a reduced size, an enhanced functionality and a reduced power consumption, and to provide an actuator suitable for use in micro-machines and micro-sensors.

The actuator of the present invention can be used in various devices, including those listed below, for example.

Those in which an actuator functions as an optical device include:

(1) those using a light-polarizing device such as printers, projection displays, barcode readers, and scanners;

(2) thin-film actuated mirror arrays;

(3) micro-optical elements: optical switching elements, focus adjusting apparatuses, variable-focus mirrors, etc.;

(4) diaphragms: optical equipment such as cameras, camcorders, and endoscopes; and (5) variable mirrors.

Those in which an actuator functions as a pump include:

(6) inkjet printers; and (7) ion generators: air cleaners, humidifiers, dust collectors.

Those in which an actuator functions as a motor include:

(8) optical pickups used in piezoelectric linear motors, and ultrasonic motors.

Those in which an actuator functions as a piezoelectric resonator:

(9) oscillators;

(10) discriminators; and

(11) filters.

Those in which an actuator functions as a sensor include:

(12) pressure sensors;

(13) acceleration sensors;

(14) shock sensors;

(15) AE (Acoustic Emission) sensors;

(16) ultrasonic sensors;

(17) angular velocity sensors; and

(18) gravity sensors.

Those in which an actuator forms a part of the mechanism include:

(19) micro-relays;

(20) super-thin film keyboards;

(21) fluid control valves; and

(22) actuators for hard disk drives (HDDs).

Third Embodiment

This embodiment is directed to a piezoelectric actuator used in an HDD, as an application of the actuator of the second embodiment.

Figure 14A:
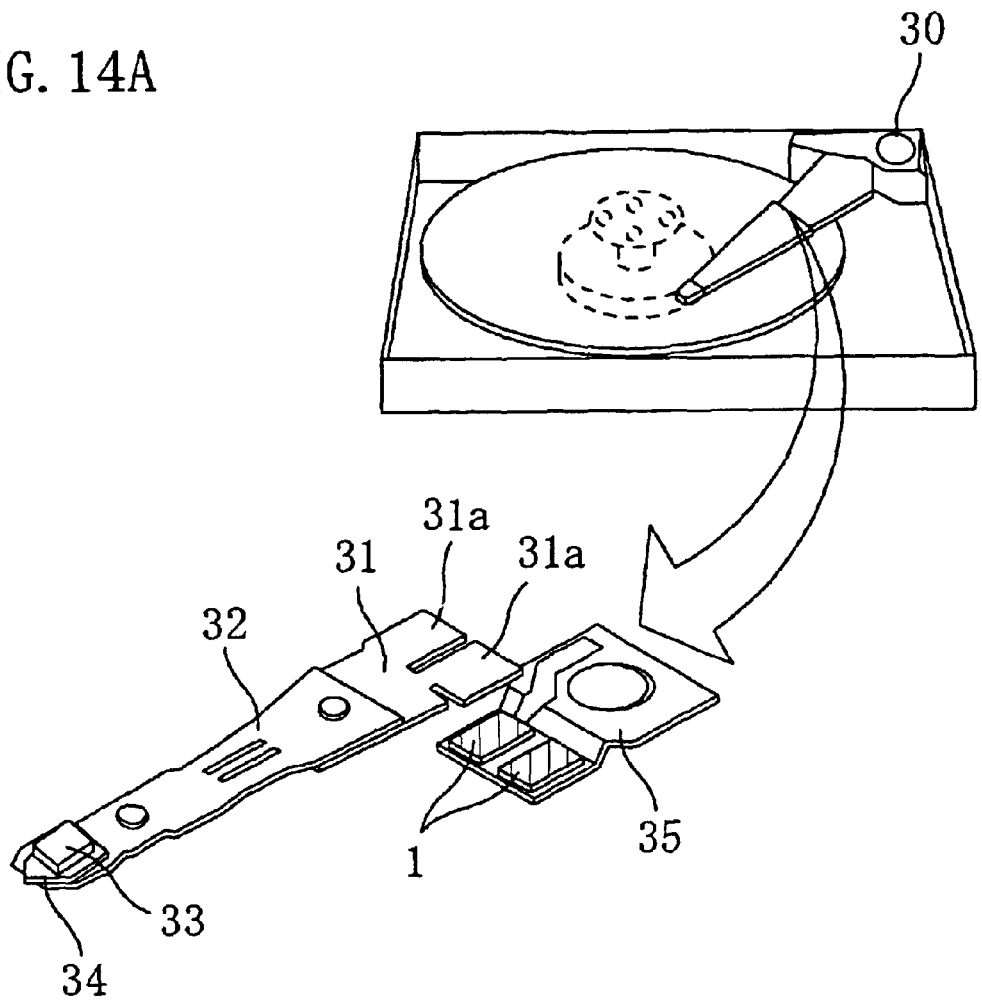
FIG. 14A is a perspective view illustrating a general structure of a first-generation piggyback actuator according to the third embodiment of the present invention.
Figure 14B:
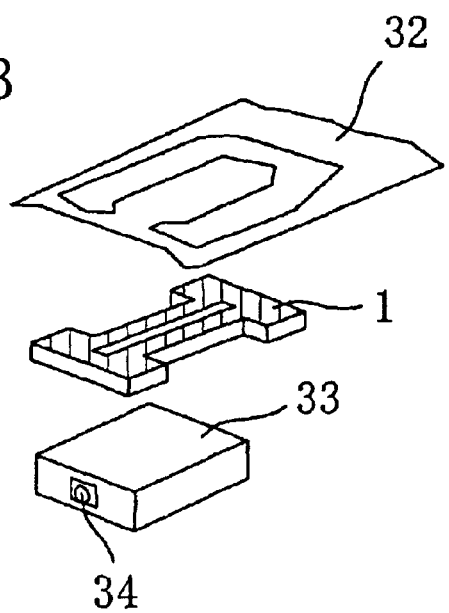
FIG. 14B is a perspective view illustrating a partial structure of a head portion of a second-generation piggyback actuator according to the third embodiment of the present invention.

FIG. 14A is a perspective view illustrating a general structure of a first-generation piggyback actuator according to the present embodiment, and FIG. 14B is a perspective view illustrating a partial structure of a head portion of a second-generation piggyback actuator according to the present embodiment.

As illustrated in FIG. 14A, the first-generation piggyback actuator includes a primary actuator using a VCM (voice coil motor) 30 as driving means, and an auxiliary actuator using the piezoelectric element 1 as auxiliary driving means. The first-generation piggyback actuator positions a magnetic head 34 by using the primary actuator and the auxiliary actuator. A plurality of piezoelectric elements 1 are attached on the upper surface of a suspension 35 made of a stainless steel plate, and are located generally at the center of gravity of the actuator mechanism. A support arm 31, including the same number of branches 31a as the piezoelectric elements 1, are attached on the upper surface of the piezoelectric elements 1, with the tip portion of the support arm 31 being connected to a suspension 32. A slider 33 having the magnetic head 34 thereon is attached to the tip portion of the suspension 32. The plurality of branches 31a are minutely-driven by the piezoelectric element 1. Thus, the branches 31a of the support arm 31 are simultaneously minutely-driven by the piezoelectric element 1 so as to minutely move the magnetic head 34.

Moreover, as illustrated in FIG. 14B, the second-generation piggyback actuator includes a primary actuator (not shown in FIG. 14B) using the VCM 30 (FIG. 14A) as driving means, and further includes the suspension 32 connected to the primary actuator via a support arm (not shown), and the slider 33 having the magnetic head 34 attached to its tip portion, with the piezoelectric element 1 being provided between the suspension 32 and the slider 33 for minutely controlling the slider 33.

The piezoelectric element 1 has a structure as described above in the first embodiment, and includes a lower electrode, a base film formed on the lower electrode, a piezoelectric film formed on the base film, and an upper electrode formed on the piezoelectric film. The material and the thickness of each of the components of the piezoelectric element 1 may suitably be selected within the range described above in the first embodiment. For example, the lower electrode is a Pt film having a thickness of 100 nm, the base film is a PLT film having a composition of $Pb_{0.85}La_{0.15}Ti_{0.9625}O_x$ and a thickness of 150 nm, the piezoelectric film is a PZT film having a composition of $PbZr_{0.5}Ti_{0.5}O_3$ and a thickness of 3 μm, and the upper electrode is an Au film having a thickness of 200 nm.

In the prior art, a piezoelectric actuator as that illustrated in FIG. 14A and FIG. 14B is obtained by forming the piezoelectric element 1 on a single crystal substrate of MgO, or the like, processing the piezoelectric element 1 by photolithography, and then transferring it to a fixed member by a transfer process. In the transfer process, the piezoelectric element 1 and the support arm 31, the piezoelectric element 1 and the suspension 32, or the piezoelectric element 1 and the slider 33, are fixed together via an adhesive or a metal junction. However, in the structure illustrated in FIG. 14B, the size of the slider 33 is as small as several millimeters or less, whereby the fixing area is also very small. Therefore, if an adhesive is used, it is very difficult to isolate the area where the adhesive is applied from the area where the adhesive is not applied. Furthermore, if a metal junction is used, the process is complicated. Moreover, when fixing the piezoelectric element 1, such a fixing operation may possibly lead to a positional error or an inclination with respect to the surface to which it is attached.

In contrast, according to the present embodiment, the piezoelectric element 1 can be formed directly on a stainless steel plate by the method described above in the first embodiment, thereby eliminating the need for adhesion or metal junction on one surface. Therefore, it is possible to reduce the manufacturing cost by eliminating the need for separately providing an expensive single crystal substrate such as an MgO substrate, to reduce the manufacturing cost by simplifying the process, and to improve the detection or recording precision by improving the mechanical precision and the functionality.

Fourth Embodiment

This embodiment is directed to an example where the piezoelectric element 1 of the present invention is used in an inkjet head.

Figure 15A:
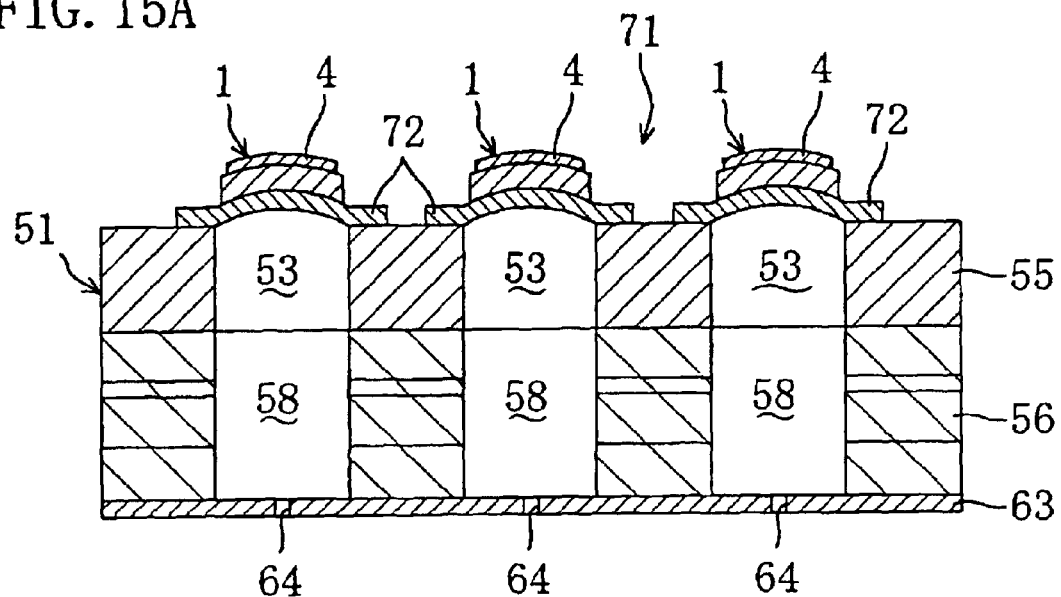
FIG. 15A is a cross-sectional view taken along line XV—XV shown in FIG. 17, illustrating an inkjet head according to the fourth embodiment of the present invention.
Figure 15B:
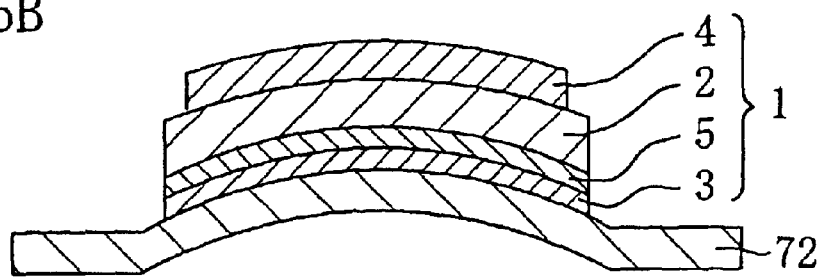
FIG. 15B is an enlarged view illustrating a part of the inkjet head of FIG. 15A.
Figure 16:
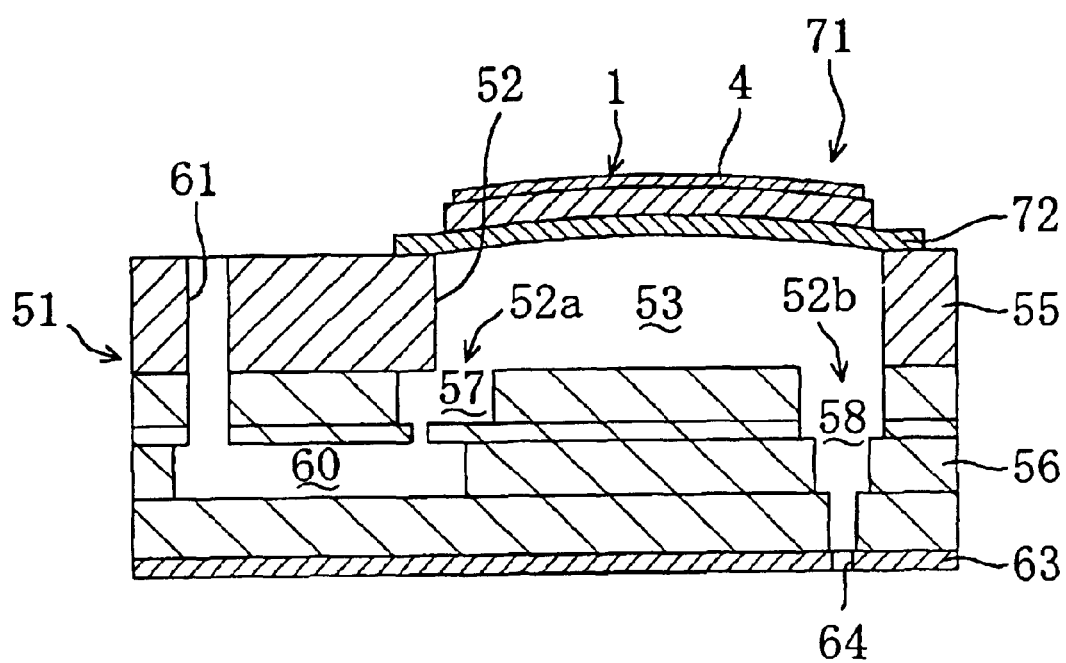
FIG. 16 is a cross-sectional view taken along line XVI—XVI shown in FIG. 17, illustrating the inkjet head according to the fourth embodiment of the present invention.
Figure 17:
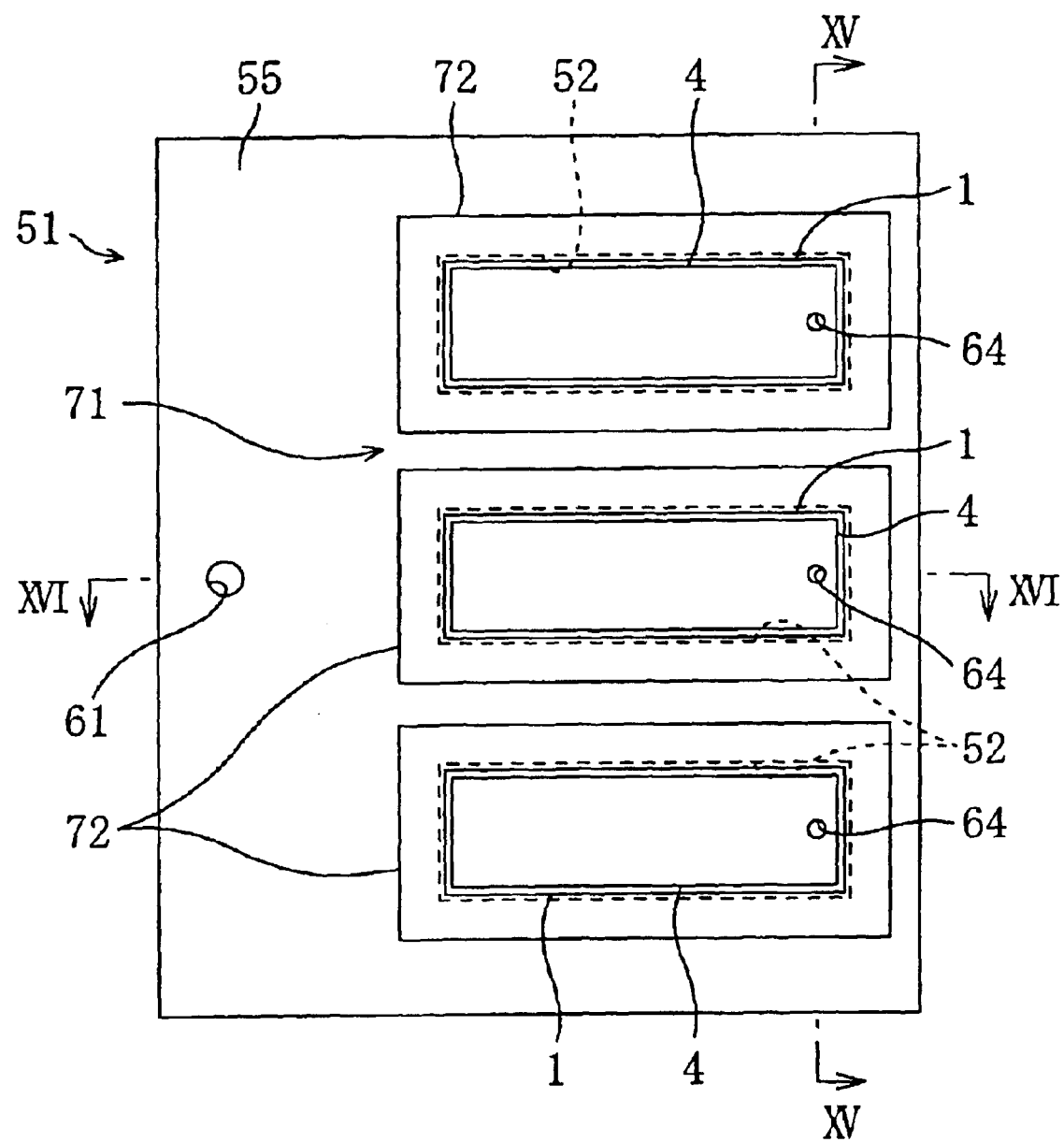
FIG. 17 is a plan view illustrating the inkjet head according to the fourth embodiment of the present invention.

FIG. 15A is a cross-sectional view taken along line XV—XV shown in FIG. 17, illustrating an inkjet head according to the fourth embodiment of the present invention, and FIG. 15B is an enlarged view illustrating a part of the inkjet head of FIG. 15A. FIG. 16 is a cross-sectional view taken along line XVI—XVI shown in FIG. 17, illustrating the inkjet head according to the fourth embodiment of the present invention. FIG. 17 is a plan view illustrating the inkjet head according to the fourth embodiment of the present invention.

As illustrated in FIG. 15A to FIG. 17, the inkjet head of the present embodiment includes a head body 51 in which a plurality of pressure chamber depressions 52 are formed. Each pressure chamber depression 52 includes a supply port 52a for supplying an ink, and a discharge port 52b for discharging an ink. The depressions 52 of the head body 51 are each formed in a generally rectangular shape on one surface (upper surface) of the head body 51, and are arranged in one direction with a predetermined interval therebetween. Note that while only three sets of depressions 52 (and nozzle holes 64, vibration plates 72, piezoelectric elements 73, upper electrodes 4, etc., to be described later) are shown in FIG. 17 for the sake of simplicity, there are actually a large number of those sets.

The side wall portion of each depression 52 is a pressure chamber member 55 made of a photosensitive glass and having a thickness of about 200 μm, and the bottom portion of each depression 52 is an ink channel member 56 fixed to the pressure chamber member 55 and made of a plurality of thin stainless steel plates laminated together. Ink supply channels 57 and ink discharge channels 58 are formed in the ink channel member 56. Each ink supply channel 57 and each ink discharge channel 58 are connected respectively to the supply port 52a and the discharge port 52b of the depression 52. The ink supply channels 57 are connected to an ink supply chamber 60 that extends in the direction in which the depressions 52 are arranged, and the ink supply chamber 60 is connected to an ink supply hole 61. The ink supply hole 61 is formed in the pressure chamber member 55 and the ink channel member 56 and is connected to an ink tank (not shown). A nozzle plate 63 made of a polymer resin such as polyimide and having a thickness of about 20 μm is provided on a surface (lower surface) of the ink channel member 56 that opposes another surface thereof that is in contact with the pressure chamber member 55. Nozzle holes 64 having a diameter of about 20 μm and connected to the ink discharge channels 58 are formed in the nozzle plate 63. The nozzle holes 64 are arranged along a straight line extending in the direction in which the depressions 52 are arranged.

A piezoelectric actuator 71 is provided on a surface (upper surface) of the pressure chamber member 55 of the head body 51 that opposes another surface thereof that is in contact with the ink channel member 56. The piezoelectric actuator 71 includes a vibration plate 72 that is a metal plate having a thickness of 1 to 3 μm and made of a stainless steel, Cr, Ni, or the like. The vibration plate 72 is provided so as to cover each depression 52 of the head body 51 to form, together with the depression 52, a pressure chamber 53. The vibration plate 72 is provided separately for each pressure chamber 53. The vibration plate 72 has a generally rectangular shape that is generally the same as that of the pressure chamber 53, as viewed in a plan view. The vibration plates 72 are electrically connected to one another by wiring (not shown), and also function as a common electrode for all the piezoelectric elements 1 as will be described later.

Moreover, each piezoelectric actuator 71 includes the piezoelectric element 1 and the upper electrode 4. The piezoelectric element 1 is made of lead zirconate titanate (PZT) and has a thickness of 2 to 5 μm. The piezoelectric element 1 is provided on a surface (upper surface) of the vibration plate 72 that opposes another surface thereof that is in contact with the pressure chamber 53 and in an area that corresponds to the pressure chamber 53. The upper electrode 4 is made of Pt and has a thickness of 0.1 μm. The upper electrode 4 is provided on a surface (upper surface) of the piezoelectric element 1 that opposes another surface thereof that is in contact with the vibration plate 72 for applying a voltage to the piezoelectric element 1 in cooperation with the vibration plate 72.

The piezoelectric element 1 has a structure as described above in the first embodiment, and includes the lower electrode 3, the base film 5 formed on the lower electrode 3, the piezoelectric film 2 formed on the base film 5, and the upper electrode 4 formed on the piezoelectric film 2. The material and the thickness of each of the components of the piezoelectric element 1 may suitably be selected within the range described above in the first embodiment. For example, the lower electrode 3 is a Pt film having a thickness of 100 nm, the base film 5 is a PLT film having a composition of $Pb_{0.85}La_{0.15}Ti_{0.9625}O_x$ and a thickness of 150 nm, the piezoelectric film 2 is a PZT film having a composition of $PbZr_{0.5}Ti_{0.5}O_3$ and a thickness of 3 μm, and the upper electrode 4 is an Au film having a thickness of 200 nm. In the manufacturing process, the lower electrode 3, the base film 5, the piezoelectric film 2 and the upper electrode 4 can be formed on a flat metal plate, and then subjected to a bending process and a patterning process so as to produce a structure as illustrated in FIG. 15B.

A portion of each vibration plate 72 corresponding to the pressure chamber 53 is curved so as to protrude, in a concave shape, away from the pressure chamber 53 (i.e., in the upward direction). In other words, the portion of each vibration plate 72 corresponding to the pressure chamber 53 is protruding away from the pressure chamber 53 with a generally arc-shaped cross section both in the width direction and in the length direction of the vibration plate 72. The piezoelectric element 1 and the upper electrode 4 are also curved upwardly, conforming to the curve of the vibration plate 72. It is preferred that the maximum amount of protrusion of the portion of each vibration plate 72 corresponding to the pressure chamber 53 (the amount of protrusion generally at the center of the vibration plate 72) away from the pressure chamber 53 is set to be 0.05 to 10 $\mu$m. If the maximum amount of protrusion is less than 0.05 $\mu$m, it is not possible to sufficiently obtain the effect of suppressing defects in the vibration plate 72 and the piezoelectric element 1 when manufacturing and when using the inkjet head, as will be described later. If the maximum amount of protrusion is greater than 10 $\mu$m, it rather increases the possibility for a crack, etc., to occur in the vibration plate 72 and the piezoelectric element 1 during the manufacturing process. Note that the maximum amount of protrusion is more preferably in the range of 0.05 to 5 $\mu$m.

Next, an operation of the inkjet head will be described. A voltage is applied between the vibration plate 72 and the upper electrode 4, thereby deforming a portion of the vibration plate 72 corresponding to the pressure chamber 53 so as to decrease the volume of the pressure chamber 53 and thus to discharge an ink out of the pressure chamber 53 through the discharge port 52b. Specifically, when a pulse voltage is applied to the piezoelectric element 1 via the vibration plate 72 and the upper electrode 4, the piezoelectric element 1 contracts in the width direction, which is perpendicular to the thickness direction, in response to the rising edge of the pulse voltage, but the vibration plate 72 does not contract, thereby deforming the portion of the vibration plate 72 corresponding to the pressure chamber 53 so that the portion is displaced toward the pressure chamber 53 (in the direction in which the amount of protrusion decreases). Such deformation creates a pressure in the pressure chamber 53, whereby a predetermined amount of the ink in the pressure chamber 53 is discharged to the outside (onto a sheet of paper on which an image is to be printed) through the discharge port 52b, the ink discharge channel 58, and the nozzle hole 64, so as to be attached to the sheet of paper in the form of a dot. Then, in response to the falling edge of the pulse voltage, the piezoelectric element 1 expands in the width direction, and the vibration plate 72 returns to its normal state. At this point, the pressure chamber 53 is refilled with an ink from the ink supply chamber 60 via the ink supply channel 57 and the supply port 52a. Note that inks of different colors, e.g., black, cyan, magenta and yellow, instead of only an ink of one color, may be discharged through different nozzle holes 64 so as to print a color image.

With a conventional manufacturing method, a piezoelectric element is formed on an MgO substrate, or the like, and then transferred onto the vibration plate 72. Moreover, in the prior art, instead of employing a transfer method, it was possible to form a piezoelectric element directly on the vibration plate 72 by sputtering, or the like. In such a case, however, the piezoelectric element did not have a satisfactory piezoelectric characteristic.

In contrast, according to the present embodiment, the piezoelectric element 1 can be formed directly on a metal plate made of a stainless steel, Cr, Ni, or the like, by the method described above in the first embodiment. Therefore, it is possible to reduce the manufacturing cost by eliminating the need for separately providing an expensive single crystal substrate such as an MgO substrate, to reduce the manufacturing cost by simplifying the process, and to improve the printing precision by improving the mechanical precision.

Alternative Embodiments

Note that in the first to fourth embodiments described above, if the substrate on which the piezoelectric element 1 is formed is made of a conductive material, e.g., a metal plate made of a stainless steel, Cr, Ni, Cr, or the like, it is not necessary to provide the piezoelectric element 1 with the lower electrode 3 because the substrate can function as a lower electrode. For practical purposes, however, if the base film is a perovskite film such as a PLT film, it is necessary to provide a barrier layer of one type or another in order to prevent the possible reaction from occurring due to the mutual diffusion between the material of the base film and the material of the substrate. In view of this, a Pt film is used as the lower electrode in the embodiments described above for practical purposes.

Similarly, if a conductive member is provided over the piezoelectric element 1, the conductive member can be used as an upper electrode.

Furthermore, in the first to fourth embodiments described above, a polycrystalline or amorphous film, such as a polycrystalline silicon film, may be provided between the lower electrode 3 and the substrate (i.e., the substrate 10 in the second embodiment, or the vibration plate 72 in the fourth embodiment).

What is claimed is:

1. A piezoelectric element, comprising:
   a substrate made of a polycrystalline or amorphous material;
   a first electrode provided on the substrate;
   a base film provided on the first electrode and having a thickness that is equal to or greater than 50 nm and less than or equal to 200 nm;
   a piezoelectric film provided on the base film; and
   a second electrode provided on the piezoelectric film,
   wherein the base film is made of an oxide having a cubic or tetragonal crystalline structure, and
   the piezoelectric film can be driven by applying voltage to the first electrode and the second electrode.

2. piezoelectric element comprising:
   a substrate made of a polycrystalline or amorphous material;
   a first electrode provided on the substrate;
   a base film provided on the first electrode and having a thickness that is equal to or greater than 50 nm and less than or equal to 200 nm;
   a piezoelectric film provided on the base film; and
   a second electrode provided on the piezoelectric film,
   wherein the base film is made of a perovskite oxide whose constituent elements do not include Zr, and
   the piezoelectric film can be driven by applying voltage to the first electrode and the second electrode.

3. A piezoelectric element comprising:
   a substrate made of a polycrystalline or amorphous material;
   a first electrode provided on the substrate;
   a base film provided on the first electrode and having a thickness that is equal to or greater than 50 nm and less than or equal to 200 nm;
   a piezoelectric film provided on the base film; and a second electrode provided on the piezoelectric film, wherein the base film is made of PLT, which is a perovskite oxide having a composition of (Pb, La)TiO$_3$, and the piezoelectric film can be driven by applying voltage to the first electrode and the second electrode.

4. The piezoelectric element of claim 1, wherein the piezoelectric film is made of a perovskite oxide containing Pb, Zr and Ti.

5. The piezoelectric element of claim 2, wherein the piezoelectric film is made of a perovskite oxide containing Pb, Zr and Ti.

6. The piezoelectric element of claim 3, wherein the piezoelectric film is made of a perovskite oxide containing Pb, Zr and Ti.

* * * * *